United States Patent
Lee

(10) Patent No.: US 7,365,513 B1
(45) Date of Patent: Apr. 29, 2008

(54) POSITIONING DEVICE HAVING DYNAMICALLY ISOLATED FRAME, AND LITHOGRAPHIC DEVICE PROVIDED WITH SUCH A POSITIONING DEVICE

(75) Inventor: Martin E. Lee, Saratoga, CA (US)

(73) Assignee: Nikon Corporation, Tokyo (JP)

( * ) Notice: Subject to any disclaimer, the term of this patent is extended or adjusted under 35 U.S.C. 154(b) by 597 days.

(21) Appl. No.: 09/449,763

(22) Filed: Nov. 26, 1999

Related U.S. Application Data

(63) Continuation of application No. 09/192,153, filed on Nov. 12, 1998, now Pat. No. 6,246,202, and a continuation-in-part of application No. 09/127,288, filed on Jul. 31, 1998, now Pat. No. 6,049,186, which is a continuation of application No. 08/627,824, filed on Apr. 2, 1996, now Pat. No. 5,942,871, which is a continuation of application No. 08/416,558, filed on Apr. 4, 1995, now Pat. No. 5,874,820, which is a continuation of application No. 08/221,375, filed on Apr. 1, 1994, now Pat. No. 5,528,118.

(51) Int. Cl.
  *H01L 21/027* (2006.01)
(52) U.S. Cl. .......................... 318/649; 355/72; 318/611
(58) Field of Classification Search ................ 318/649, 318/687, 611, 623; 33/1 M; 74/471 XY, 74/490.07, 490.08; 355/53, 72, 75; 414/749.1, 414/749.2
See application file for complete search history.

(56) References Cited

U.S. PATENT DOCUMENTS

RE27,289 E  2/1972 Sawyer
RE27,436 E  7/1972 Sawyer
3,789,285 A  1/1974 Nishizawa (Continued)

FOREIGN PATENT DOCUMENTS

JP  63-20014  4/1988

OTHER PUBLICATIONS

Moriyama, et al., "*Precision X-Y Stage with a Piezo-driven Fine-table*," The Bulletin of The Japan Society Precision Engineering, vol. 22, No. 1, pp. 13-17, Mar. 1988.

*Primary Examiner*—Bentsu Ro
(74) *Attorney, Agent, or Firm*—Oliff & Berridge, PLC

(57) ABSTRACT

A guided stage mechanism suitable for supporting a reticle in a photolithography machine includes a stage movable in the X-Y directions on a base. Laterally surrounding the stage is a rectangular window frame guide which is driven in the X-axis direction on two fixed guides by means of motor coils on the window frame guide cooperating with magnetic tracks fixed on the base. The stage is driven inside the window frame guide in the Y-axis direction by motor coils located on the stage cooperating with magnetic tracks located on the window frame guide. Forces from the drive motors of both the window frame guide and the stage are transmitted through the center of gravity of the stage, thereby eliminating unwanted moments of inertia. Additionally, reaction forces caused by the drive motors are isolated from the projection lens and the alignment portions of the photolithography machine. This isolation is accomplished by providing a mechanical support for the stage independent of the support for its window frame guide. The window frame guide is a hinged structure capable of a slight yawing (rotational) motion due to hinged flexures which connect the window frame guide members.

8 Claims, 18 Drawing Sheets

U.S. PATENT DOCUMENTS

| | | |
|---|---|---|
| 3,889,164 A | 6/1975 | Nishizawa et al. |
| 3,935,486 A | 1/1976 | Nagashima |
| 3,943,778 A | 3/1976 | Wyse |
| 4,019,109 A | 4/1977 | McCoy et al. |
| 4,087,729 A | 5/1978 | Yamazaki et al. |
| 4,129,291 A | 12/1978 | Kato et al. |
| 4,234,175 A | 11/1980 | Sato et al. |
| 4,392,642 A | 7/1983 | Chitayat |
| 4,409,860 A | 10/1983 | Moriyama et al. |
| 4,425,508 A | 1/1984 | Lewis, Jr. et al. |
| 4,443,743 A | 4/1984 | Forys et al. |
| 4,485,339 A | 11/1984 | Trost |
| 4,492,356 A | 1/1985 | Taniguchi et al. |
| 4,504,144 A | 3/1985 | Trost |
| 4,506,204 A | 3/1985 | Galburt |
| 4,506,205 A | 3/1985 | Trost et al. |
| 4,507,597 A | 3/1985 | Trost |
| 4,514,858 A | 4/1985 | Novak |
| 4,516,253 A | 5/1985 | Novak |
| 4,525,659 A | 6/1985 | Imahashi et al. |
| 4,575,942 A | 3/1986 | Moriyama |
| 4,598,242 A * | 7/1986 | Hayashi et al. ............. 318/640 |
| 4,615,515 A | 10/1986 | Suzuta et al. |
| 4,628,238 A | 12/1986 | Smulders et al. |
| 4,630,942 A | 12/1986 | Tsumaki et al. |
| 4,636,626 A * | 1/1987 | Hazama et al. ............. 250/201 |
| 4,641,071 A | 2/1987 | Tazawa et al. |
| 4,648,723 A | 3/1987 | Sugiyama et al. |
| 4,648,724 A | 3/1987 | Sugiyama et al. |
| 4,653,408 A | 3/1987 | Nagashima et al. |
| 4,654,571 A | 3/1987 | Hinds |
| 4,667,139 A | 5/1987 | Hirai et al. |
| 4,675,891 A | 6/1987 | Plessis et al. |
| 4,677,651 A | 6/1987 | Hartl et al. |
| 4,684,315 A | 8/1987 | Sugishima et al. |
| 4,687,980 A | 8/1987 | Phillips et al. |
| 4,698,575 A | 10/1987 | Bouwer |
| 4,708,465 A | 11/1987 | Isohata et al. |
| 4,723,086 A | 2/1988 | Leibovich et al. |
| 4,742,286 A | 5/1988 | Phillips |
| 4,744,675 A | 5/1988 | Sakino et al. |
| 4,750,721 A | 6/1988 | Sasada |
| 4,770,531 A | 9/1988 | Tanaka et al. |
| 4,803,712 A | 2/1989 | Kembo et al. |
| 4,808,892 A | 2/1989 | Dreibelbis |
| 4,812,725 A | 3/1989 | Chitayat |
| 4,817,930 A | 4/1989 | Van Deuren |
| 4,818,169 A | 4/1989 | Schram et al. |
| 4,870,668 A | 9/1989 | Frankel et al. |
| 4,887,804 A | 12/1989 | Ohtsuka |
| 4,891,526 A | 1/1990 | Reeds |
| 4,916,340 A | 4/1990 | Negishi |
| 4,948,330 A | 8/1990 | Nomura et al. |
| 4,952,858 A | 8/1990 | Galburt |
| 4,993,696 A | 2/1991 | Furukawa et al. |
| 4,998,821 A * | 3/1991 | Ohta et al. .................. 353/122 |
| 5,022,619 A | 6/1991 | Mamada |
| 5,040,431 A | 8/1991 | Sakino et al. |
| 5,059,090 A | 10/1991 | Bobroff et al. |
| 5,073,912 A | 12/1991 | Kobayashi et al. |
| 5,120,034 A | 6/1992 | Van Engelen |
| 5,140,242 A | 8/1992 | Doran et al. |
| 5,150,153 A | 9/1992 | Franken et al. |
| 5,172,160 A | 12/1992 | Van Eijk et al. |
| 5,184,055 A | 2/1993 | Ohishi et al. |
| 5,208,497 A | 5/1993 | Ishii et al. |
| 5,228,358 A | 7/1993 | Sakino et al. |
| 5,241,183 A | 8/1993 | Kanai et al. |
| 5,243,491 A | 9/1993 | Van Eijk et al. |
| 5,260,580 A | 11/1993 | Itoh et al. |
| 5,280,677 A | 1/1994 | Kubo et al. |
| 5,285,142 A | 2/1994 | Galburt et al. |
| 5,309,847 A | 5/1994 | Matsumoto |
| 5,323,712 A | 6/1994 | Kikuiri |
| 5,327,060 A | 7/1994 | Van Engelen |
| 5,338,121 A | 8/1994 | Kobayashi et al. |
| 5,385,217 A | 1/1995 | Watanabe et al. |
| 5,400,674 A | 3/1995 | Arnune et al. |
| 5,453,315 A | 9/1995 | Hamilton et al. |
| 5,467,720 A | 11/1995 | Korenaga et al. |
| 5,471,802 A | 12/1995 | Yano et al. |
| 5,504,407 A | 4/1996 | Wakui et al. |
| 5,508,518 A | 4/1996 | Kendall |
| 5,524,502 A | 6/1996 | Osanai |
| 5,528,118 A | 6/1996 | Lee |
| 5,530,516 A | 6/1996 | Sheets |
| 5,552,888 A | 9/1996 | Sogard et al. |
| 5,578,164 A | 11/1996 | Kurano et al. |
| 5,581,521 A | 12/1996 | Nomura et al. |
| 5,623,853 A | 4/1997 | Novak et al. |
| 5,744,924 A | 4/1998 | Lee |
| 5,757,149 A | 5/1998 | Sato et al. |
| 5,760,564 A | 6/1998 | Novak |
| 5,812,420 A | 9/1998 | Takahashi |
| 5,844,666 A | 12/1998 | Van Engelen et al. |
| 5,874,820 A | 2/1999 | Lee |
| 5,942,871 A | 8/1999 | Lee |
| 5,953,105 A | 9/1999 | Van Engelen et al. |

* cited by examiner

POSITIONING DEVICE HAVING DYNAMICALLY ISOLATED FRAME, AND LITHOGRAPHIC DEVICE PROVIDED WITH SUCH A POSITIONING DEVICE

This is a continuation of prior U.S. patent application Ser. No. 09/192,153, filed Nov. 12, 1998 now U.S. Pat. No. 6,246,202, which is a continuation of U.S. patent application Ser. No. 08/416,558, filed Apr. 4, 1995, now U.S. Pat. No. 5,874,820. This also is a continuation-in-part of U.S. patent application Ser. No. 09/127,288, filed Jul. 31, 1998 now U.S. Pat. No. 6,049,186, which is a continuation of U.S. patent application Ser. No. 08/627,824, filed Apr. 2, 1996, now U.S. Pat. No. 5,942,871, which is a continuation of U.S. patent application Ser. No. 08/221,375, filed Apr. 1, 1994, now U.S. Pat. No. 5,528,118. The entire disclosure of the prior applications are hereby incorporated by reference herein in their entirety.

BACKGROUND OF THE INVENTION

1. Field of the Invention

This invention relates to precision motion stages and more specifically to a stage suitable for use in a photolithography machine and especially adapted for supporting a reticle.

2. Description of the Prior Art

Photolithography is a well known field especially as applied to semiconductor fabrication. In photolithography equipment, a stage (an X-Y motion device) supports the reticle (i.e., mask) and a second stage supports the semiconductor wafer, i.e., the work piece being processed. Sometimes only a single stage is provided, for the wafer or the mask.

Such stages are essential for precision motion in the X-axis and Y-axis directions and often some slight motion is provided for adjustments in the vertical (Z-axis) direction. A reticle stage is typically used where the reticle is being scanned in a scanning exposure system, to provide smooth and precise scanning motion in one linear direction and insuring accurate, reticle to wafer alignment by controlling small displacement motion perpendicular to the scanning direction and a small amount of "yaw" (rotation) in the X-Y plane. It is desirable that such an X-Y stage be relatively simple and be fabricated from commercially available components in order to reduce cost, while maintaining the desired amount of accuracy. Additionally, many prior art stages include a guide structure located directly under the stage itself. This is not desirable in a reticle stage since it is essential that a light beam be directed through the reticle and through the stage itself to the underlying projection lens. Thus, a stage is needed which does not include any guides directly under the stage itself, since the stage itself must define a fairly large central passage for the light beam.

Additionally, many prior art stages do not drive the stage through its center of gravity which undesirably induces a twisting motion in the stage, reducing the frequency response of the stage. Therefore, there is a need for an improved stage and especially one suitable for a reticle stage.

SUMMARY

A precision motion stage mechanism includes the stage itself which moves in the X-Y plane on a flat base. The stage is laterally surrounded by a "window frame" guide structure which includes four members attached at or near their corners to form a rectangular structure. The attachments are flexures which are a special type of hinge allowing movement to permit slight distortion of the rectangle. In one version, these flexures are thin stainless steel strips attached in an "X" configuration, allowing the desired degree of hinge movement between any two adjacent connected window frame members.

The window frame guide structure moves on a base against two spaced-apart and parallel fixed guides in, e.g., the X axis direction, being driven by motor coils mounted on two opposing members of the window frame cooperating with magnetic tracks fixed on the base.

The window frame in effect "follows" the movement of the stage and carries the magnetic tracks needed for movement of the stage in the Y axis direction. (It is to be understood that references herein to the X and Y axes directions are merely illustrative and for purposes of orientation relative to the present drawings and are not to be construed as limiting.)

The stage movement in the direction perpendicular (the Y axis direction) to the direction of movement of the window frame is accomplished by the stage moving along the other two members of the window frame. The stage is driven relative to the window frame by motor coils mounted on the stage and cooperating with magnetic tracks mounted in the two associated members of the window frame.

To minimize friction, the stage is supported on the base by air bearings or other fluid bearings mounted on the underside of the stage. Similarly, fluid bearings support the window frame members on their fixed guides. Additionally, fluid bearings load the window frame members against the fixed guides and load the stage against the window frame. So as to allow slight yaw movement, these loading bearings are spring mounted. The stage itself defines a central passage. The reticle rests on a chuck mounted on the stage. Light from an illuminating source typically located above the reticle passes to the central passage through the reticle and chuck to the underlying projection lens.

It is to be understood that the present stage, with suitable modifications, is not restricted to supporting a reticle but also may be used as a wafer stage and is indeed not limited to photolithography applications but is generally suited to precision stages.

An additional aspect in accordance with the invention is that the reaction force of the stage and window frame drive motors is not transmitted to the support frame of the photolithography apparatus projection lens but is transmitted independently directly to the earth's surface by an independent supporting structure. Thus, the reaction forces caused by movement of the stage do not induce undesirable movement in the projection lens or other elements of the photolithography machine.

This physically isolating the stage reaction forces from the projection lens and associated structures prevents these reaction forces from vibrating the projection lens and associated structures. These structures include the interferometer system used to determine the exact location of the stage in the X-Y plane and the wafer stage. Thus, the reticle stage mechanism support is spaced apart from and independently supported from the other elements of the photolithography machine and extends to the surface of the earth.

Advantageously, the reaction forces from operation of the four motor coils for moving both the stage and its window frame are transmitted through the center of gravity of the stage, thereby desirably reducing unwanted moments of force (i.e., torque). The controller controlling the power to the four drive motor coils takes into consideration the relative position of the stage and the frame and proportions the driving force accordingly by a differential drive technique.

DETAILED DESCRIPTION OF THE PREFERRED EMBODIMENT

Figure 1:
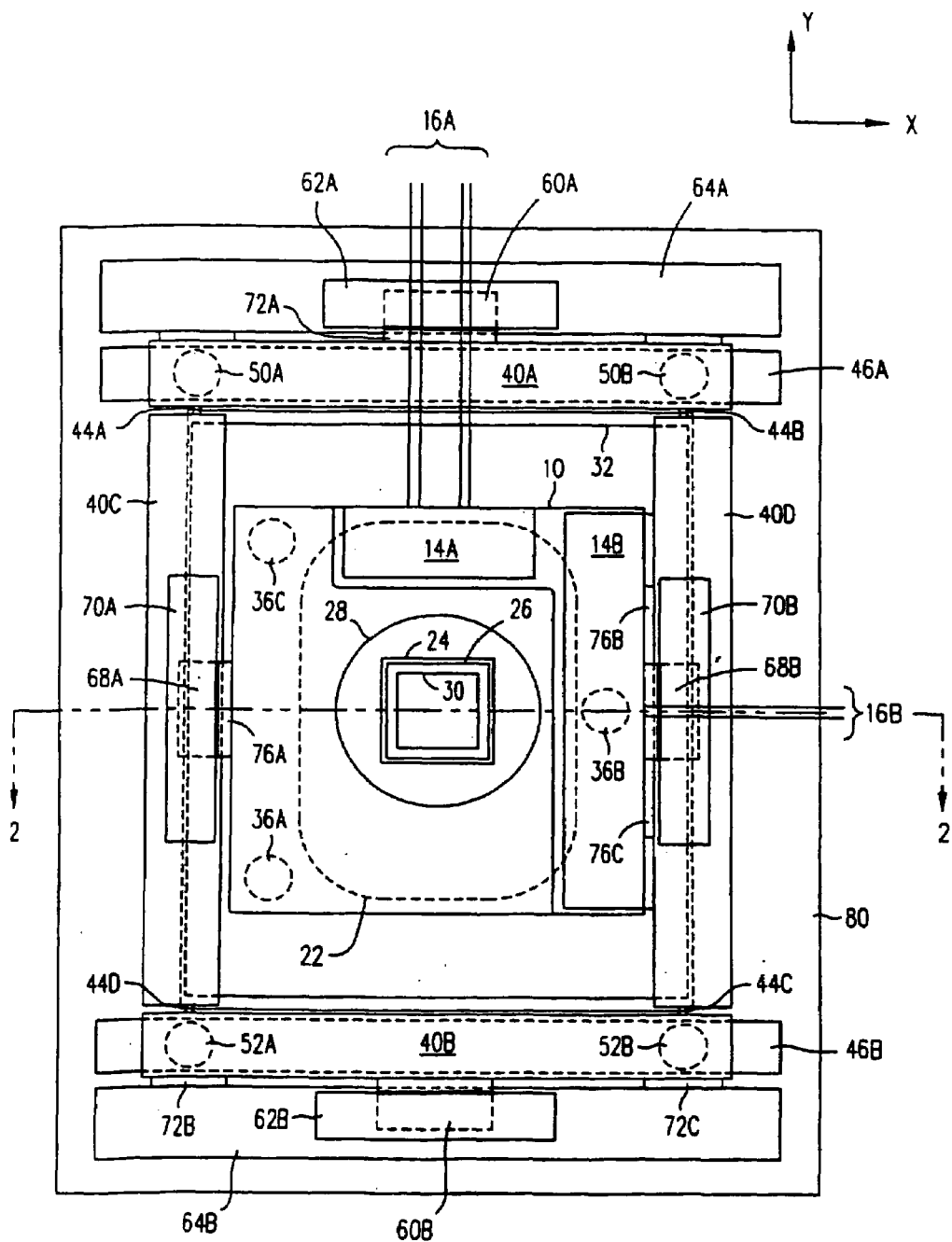
FIG. 1 shows a top view of a window frame guided stage.

FIG. 1 shows a top view of a stage mechanism in accordance with the invention. See also copending commonly owned and invented U.S. patent application Ser. No. 08/221,375 entitled "Guideless Stage with Isolated Reaction Stage" filed Apr. 1, 1994, which is incorporated herein by reference and shows a related method of supporting elements of a stage mechanism so as to isolate reaction forces from the projection lens and other parts of a photolithography apparatus.

The detailed description from U.S. patent application Ser. No. 08/221,375 is reproduced below. FIGS. 1-11 of that application have been renumbered respectively as FIGS. 7-17, and the reference numerals have been increased by 200 in order to avoid the use of duplicate reference numerals for different elements.

While it will be appreciated by those skilled in the art that the guideless stage, with or without its isolating reaction frame, has many applications to many different types of instruments for precise positioning of objects, the invention will be described with respect to a preferred embodiment in the form of a microlitholigraphic instrument for aligning wafers in a system where a lens produces an image which is exposed to the photoresist on the wafer surface. In addition, while the guideless stage with or without its isolation stage can be utilized as a guideless object stage movable in just one direction, such as a X or an Y direction, the preferred embodiment is directed to a guideless XY wafer stage as described below.

Figure 7:
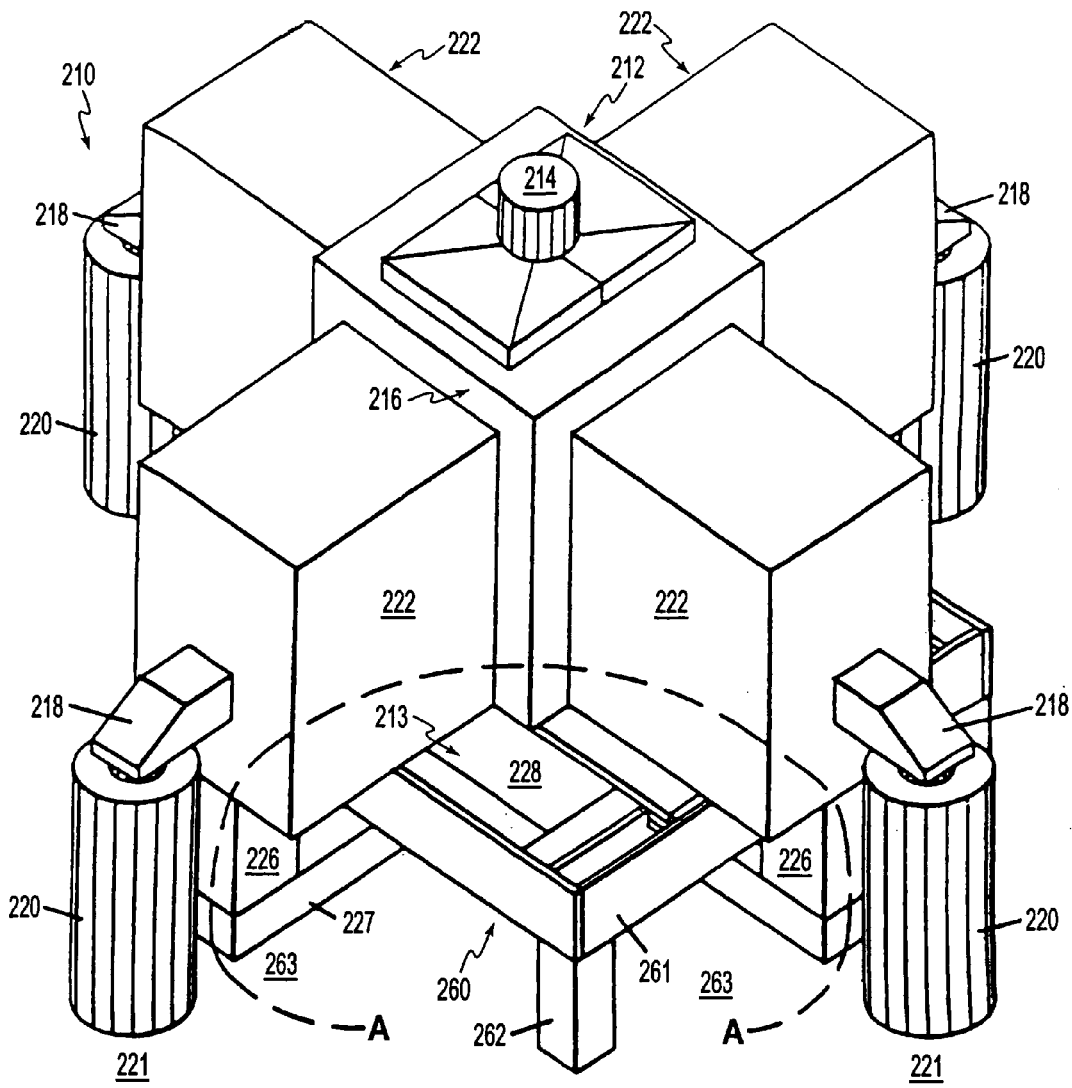
FIG. 7 is a perspective view of a microlithography system.
Figure 8:
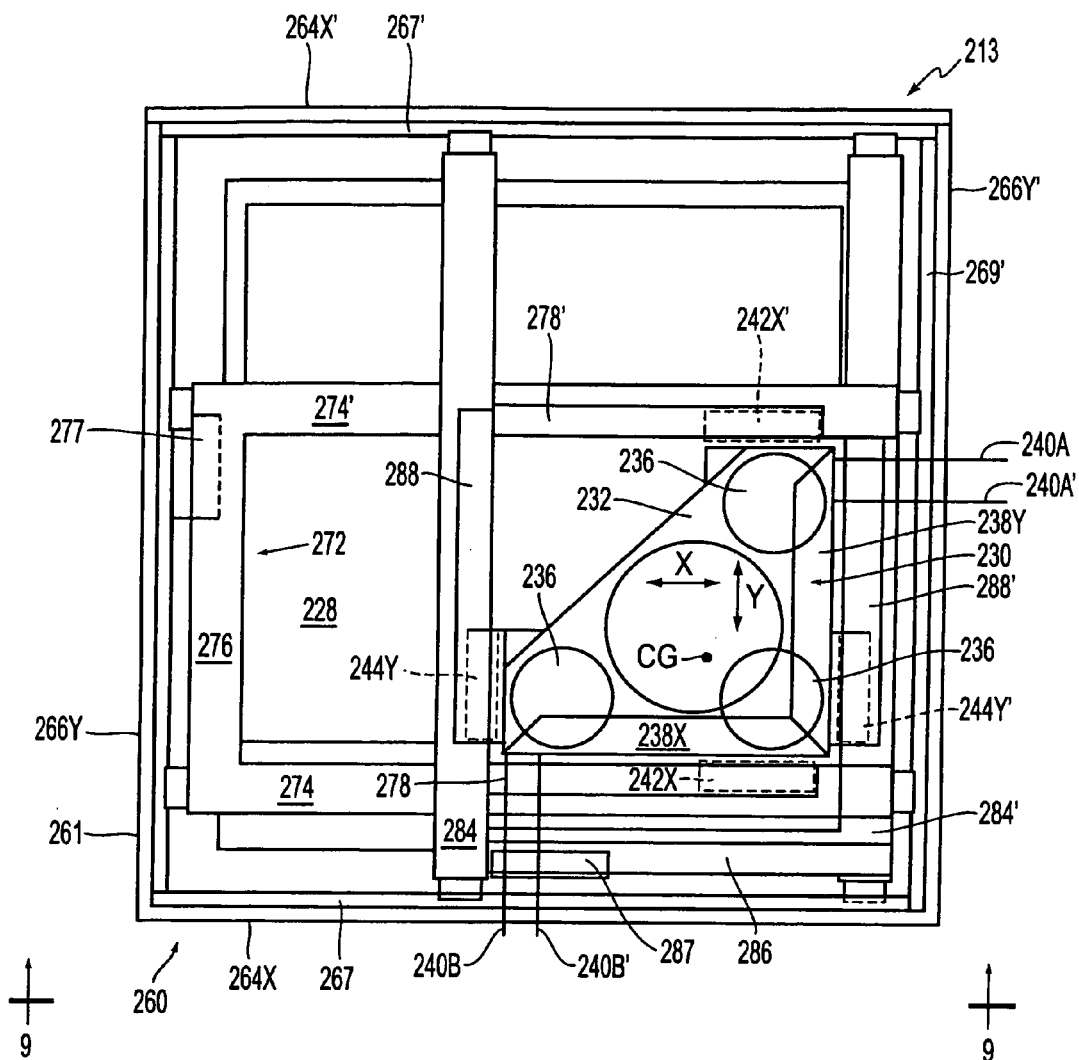
FIG. 8 is a plan view of the wafer XY stage position above the reaction stage.

Referring now to the drawings, with particular reference to FIGS. 7 and 8, there is shown a photolithographic instrument 210 having an upper optical system 212 and a lower wafer support and positioning system 213. The optical system 212 includes an illuminator 214 including a lamp LMP, such as a mercury lamp, and an ellipsoid mirror EM surrounding the lamp LPM. The illuminator 214 comprises optical integrator such as a fly's eye lens FEL producing secondary light source images and a condenser lens CL for illuminating a reticle (mask) R with uniformed light flux. A mask holder RST holding the mask R is mounted above a lens barrel PL of a projection optical system 216. The lens barrel PL is fixed on a part of a column assembly which is supported on a plurality of rigid arms 218 each mounted on the top portion of an isolation pad or block system 220.

Figure 7A:
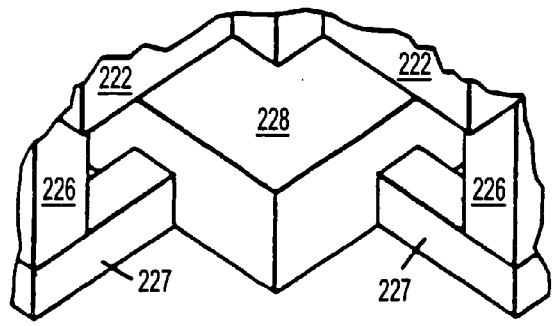
FIG. 7A is a view of a portion of the structure shown in FIG. 7 delineated by line A-A and with the reaction stage which is shown FIG. 7 removed.
Figure 7B:
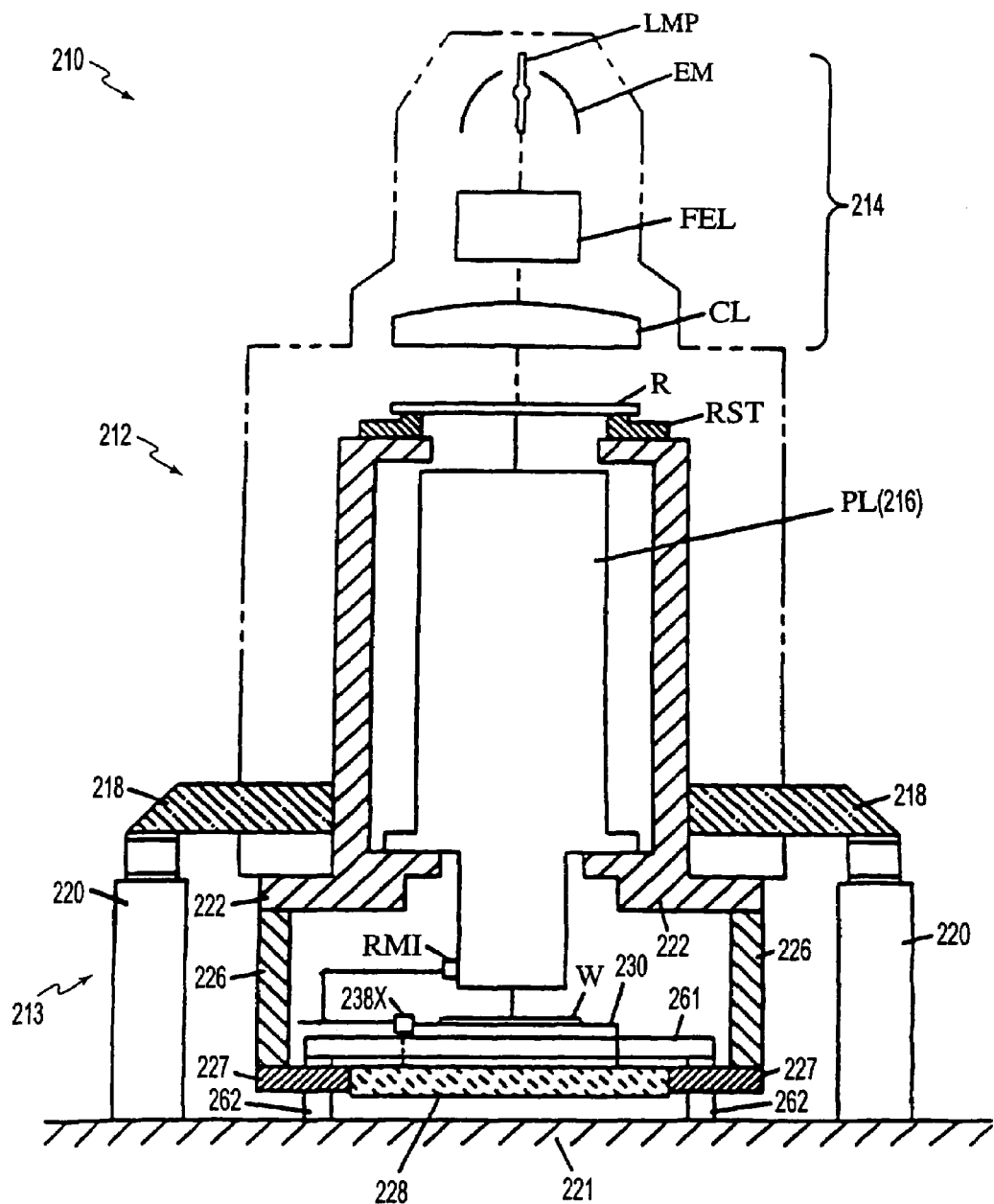
FIG. 7B is an elevational view, partially in section, of the structure shown in FIG. 7.
Figure 9:
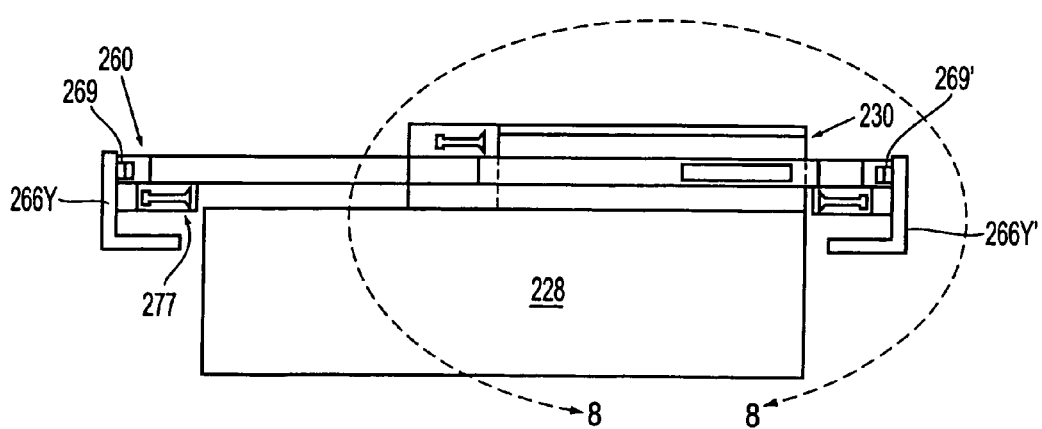
FIG. 9 is a side elevational view of a portion of the structure shown in FIG. 8 taken along line 9-9 in the direction of the arrows.
Figure 9A:
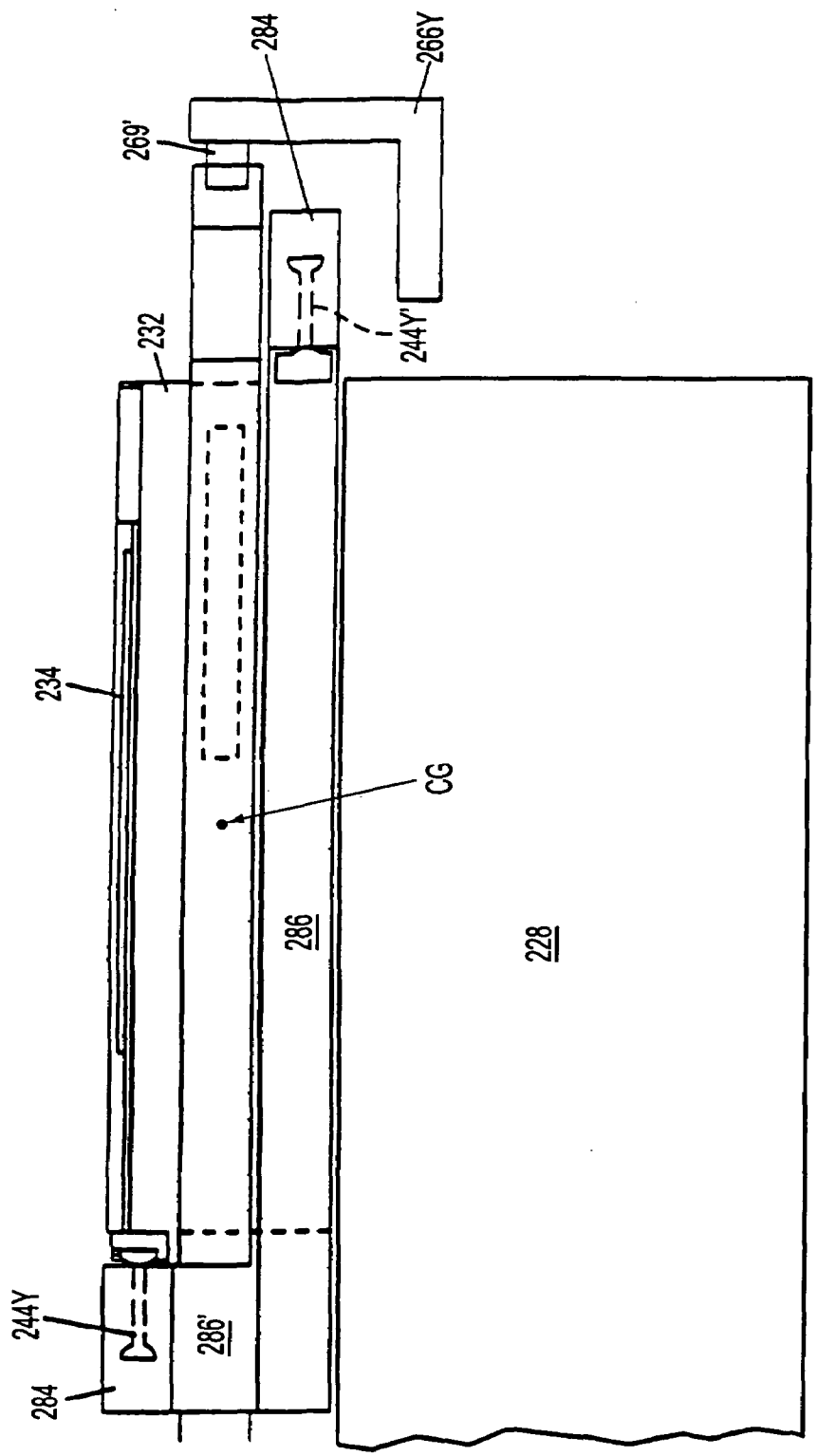
FIG. 9A is an enlarged view of a portion of the structure shown in FIG. 9 delineated by line B-B.

Inertial or seismic blocks 222 are located on the system such as mounted on the arms 218. These blocks 222 can take the form of a cast box which can be filled with sand at the operation site to avoid shipment of a massive structure. An object or wafer stage base 228 is supported from the arms 218 by depending blocks 222 and depending bars 226 and horizontal bars 227 (see FIG. 7A). FIG. 7B is an elevational view, partially in section, of the structure shown in FIG. 7 except that in FIG. 7B the blocks 222 are shown as being a different configuration than in FIGS. 7 and 7A. Referring now to FIGS. 8 and 9, there are shown plan and elevational views, respectively, of the wafer supporting and positioning apparatus above the object or wafer stage base 228 including the object or wafer or XY stage 230 and the reaction frame assembly 260. The XY stage 230 includes a support plate 232 on which the wafer 234, such as a 12 inch wafer, is supported. The plate 232 is supported in space above the object stage base 228 via vacuum pre-load type air bearings 236 which can be controlled to adjust Z, i.e., tilt roll and focus. Alternatively, this support could employ combinations of magnets and coils.

The XY stage 230 also includes an appropriate element of a magnetic coupling means such as a linear drive motor for aligning the wafer with the lens of the optical system 216 for precisely positioning an image for exposure of a photoresist on the wafer's surface. In the embodiment illustrated, the magnetic coupling means takes the form of a pair of drive members such as X drive coils 242X and 242X' for positioning the XY stage 230 in the X direction and a pair of Y drive members such as drive coils 244Y and 244Y' for positioning the XY stage 230 in the Y direction. The associated portion of the magnetic coupling means on the reaction frame assembly 260 will be described in later detail below.

The XY stage 230 includes a pair of laser mirrors 238X operative with respect to a pair of laser beams 240A/240A' and 238Y operative with respect to a pair of laser beams 240B/240B' of a laser beam interferometer system 292 for determining and controlling the precise XY location of the XY stage relative to a fixed mirror RMX at the lower part of the lens barrel PL of the projection optical system 216.

Figure 10:
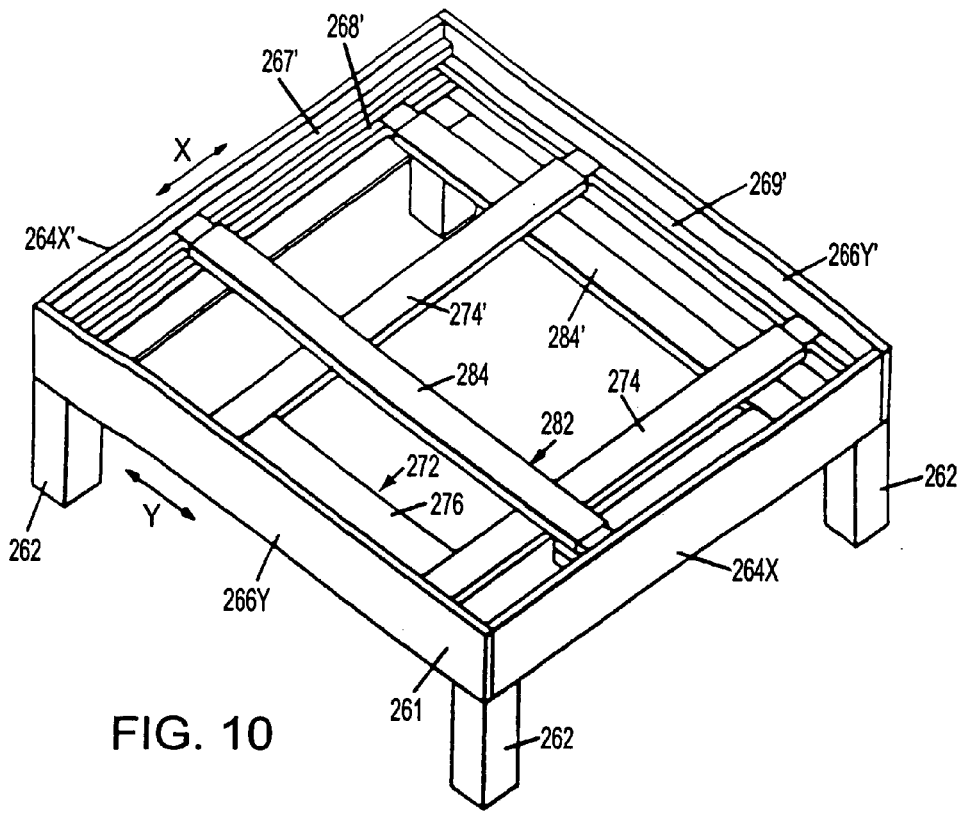
FIG. 10 is a perspective view of the reaction stage showing the XY followers without the means for coupling to the XY stage for positioning of the XY stage.
Figure 10A:
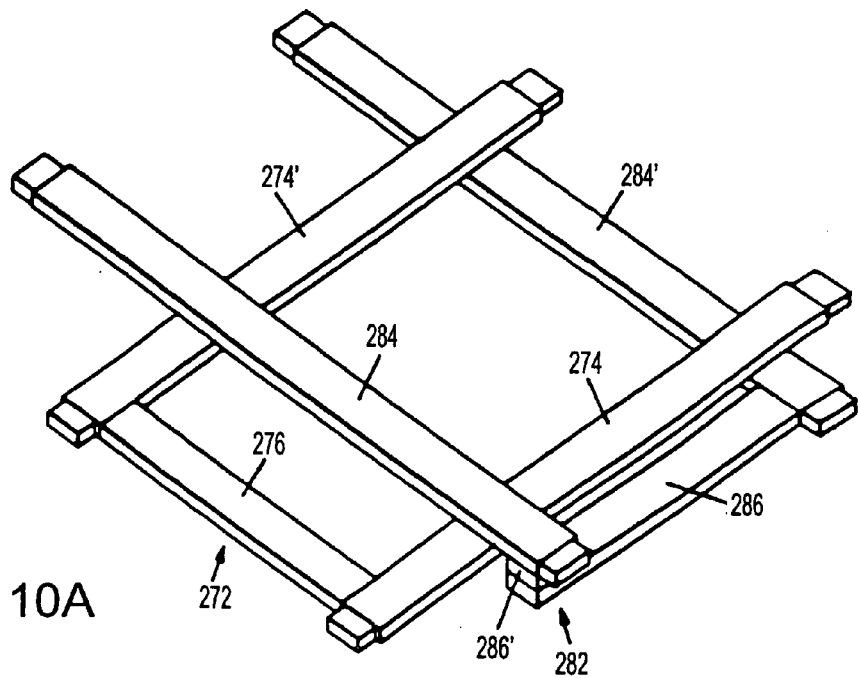
FIG. 10A is an enlarged perspective view of the XY followers illustrated in FIG. 10.

Referring to FIGS. 10 and 10A, the reaction frame assembly 260 has a reaction frame 261 which includes a plurality of support posts 262 which are mounted on the ground or a separate base substantially free from transferring vibrations between itself and the object stage.

The reaction frame 261 includes face plates 264X and 264X' extending between support posts 262 in the X direction and 266Y and 266Y' extending between support posts in the Y direction. Inside the face plates 264-266 a plurality of reaction frame rails 267-269 and 267'-269' are provided for supporting and guiding an X follower 272 and a Y follower 282. Inside face plate 264X are an upper follower guide rail 267 and a lower follower guide rail 268 (not shown) and on the inside surface of the opposite face plate 264X' are upper and lower follower guide rails 267' and 268'. On the inside surfaces of each of the face plates 266Y and 266Y' is a single guide rail 269 and 269', respectively, which is positioned vertically in between the guide rails 267 and 268.

The X follower includes a pair of spaced apart arms 274 and 274' connected at their one end by a cross piece 276. Drive elements such as drive tracks 278 and 278' (see FIG. 8) are mounted on the arms 274 and 274', respectively, for cooperating with the drive elements 242X and 242X' of the XY stage. Since in the illustrated embodiment the drive elements 242X and 242X' on the XY stage are shown as drive coils, the drive tracks on the X follower 272 take the form of magnets. The coupling elements could be reversed so that the coils would be mounted on the X follower and the magnets mounted on the XY stage. As the XY stage is driven in the X and Y direction, the laser interferometer system 292 detects the new position of the XY stage momentarily and generates a position information (X coordinate value). As described in greater detail below with reference to FIG. 11, a servo position control system 294 under control of a host processor (CPU) 296 controls the position of the X follower 272 and the Y follower 282 in response to the position information from the interferometer system 292 to follow the XY stage 230 without any connection between the drive coils 242X, 242X' and the tracks 274, 274'.

For movably mounting the X follower 272 on the reaction frame 261, the ends of the arms 274 and 274' at the side of the reaction frame 261 ride or are guided on the rail 269, and the opposite ends of the arms 274 and 274' ride on rail 269' adjacent face plate 266Y'. For moving the X follower 272 a drive member 277 is provided on the cross piece 276 for cooperating with the reaction frame guide 269 for moving the follower 272 in a direction which is perpendicular to the X direction of the XY stage. Since the precision drive and control takes place in the XY stage 230, the positioning control of the X follower 272 does not have to be as accurate and provide as close tolerances and air gaps as the XY stage 230. Accordingly, the drive mechanism 277 can be made of a combination of a screw shaft rotated by a motor and a nut engaged by the X follower 272 or a combination of a coil assembly and a magnet assembly to establish a linear motor and each combination can be further combined with a roller guiding mechanism.

Similar to the X follower 272, the Y follower 282 includes a pair of arms 284 and 284' connected at their one end by a crossbar 286 and including drive tracks 288 and 288' for cooperating with the Y drive members 244Y and 244Y'. The arms 284 and 284' of the Y follower 282 are guided on separate guide rails. The ends of arm 284 ride or are guided on the upper rails 267 and 267' and the ends of arm 284' are guided on lower rails 268 and 268'. A drive mechanism 287 is provided on the cross piece 286 of the Y follower 282 for moving the Y follower 282 along guides 267, 267', 268 and 268' between the face plates 266Y and 266Y' in a direction perpendicular to the Y direction of the XY stage.

As best illustrated in FIG. 10A, the arms 274 and 274' and crossbar 276' of the X follower 272 all lie within and move in the same plane crossing the Z axis. The center of gravity of the XY stage 230 lies within or is immediately adjacent to this plane. In this construction the drive forces from each of the drive coils 242X and 242X' are in a direction along the length of the arms 274 and 274', respectively. However, the arms 284 and 284' of the Y follower 282 lie within and move in different parallel planes spaced apart along the Z axis from one another respectively above and below and parallel to the plane containing the X follower 272. In the preferred embodiment, the crossbar 286 lies in the lower plane containing the arm 284' and a spacer block 286' is positioned between the overlapping ends of the arm 284 and crossbar 286 to space the arms 284 and 284' in their respective parallel planes. As with X follower 272, the drive forces from each of the drive coils 244Y and 244Y' are in a direction along the length of the arms 284 and 284'. Also, predetermined gaps in X and Z directions are maintained between the drive coils 244Y (244Y') and the drive tracks 288 (288') to achieve the guideless concept.

In operation of the guideless stage and isolated reaction frame of the invention, the XY stage 230 is positioned in an initial position relative to the projection lens as sensed by the interferometer system 292, and the XY stage 230 is supported in the desired Z direction from the object stage base 228 by the air bearings 236 with the drive coils 242X, 242X', 244Y and 244Y' spaced from the drive elements in the form of drive tracks 278, 278', 288 and 288', respectively. There is no direct contact between the XY stage 230 and the reaction frame 261. That is, there is no path for the vibration of the reaction frame to affect the position of the XY stage and vice versa. There is only indirect contact via the transmission means that deliver the signals to the coils and the laser interferometer position sensing system which then transmits sensed position information to the controller which receives other commands to initiate drive signals which result in movement of the XY stage 230.

Figure 11:
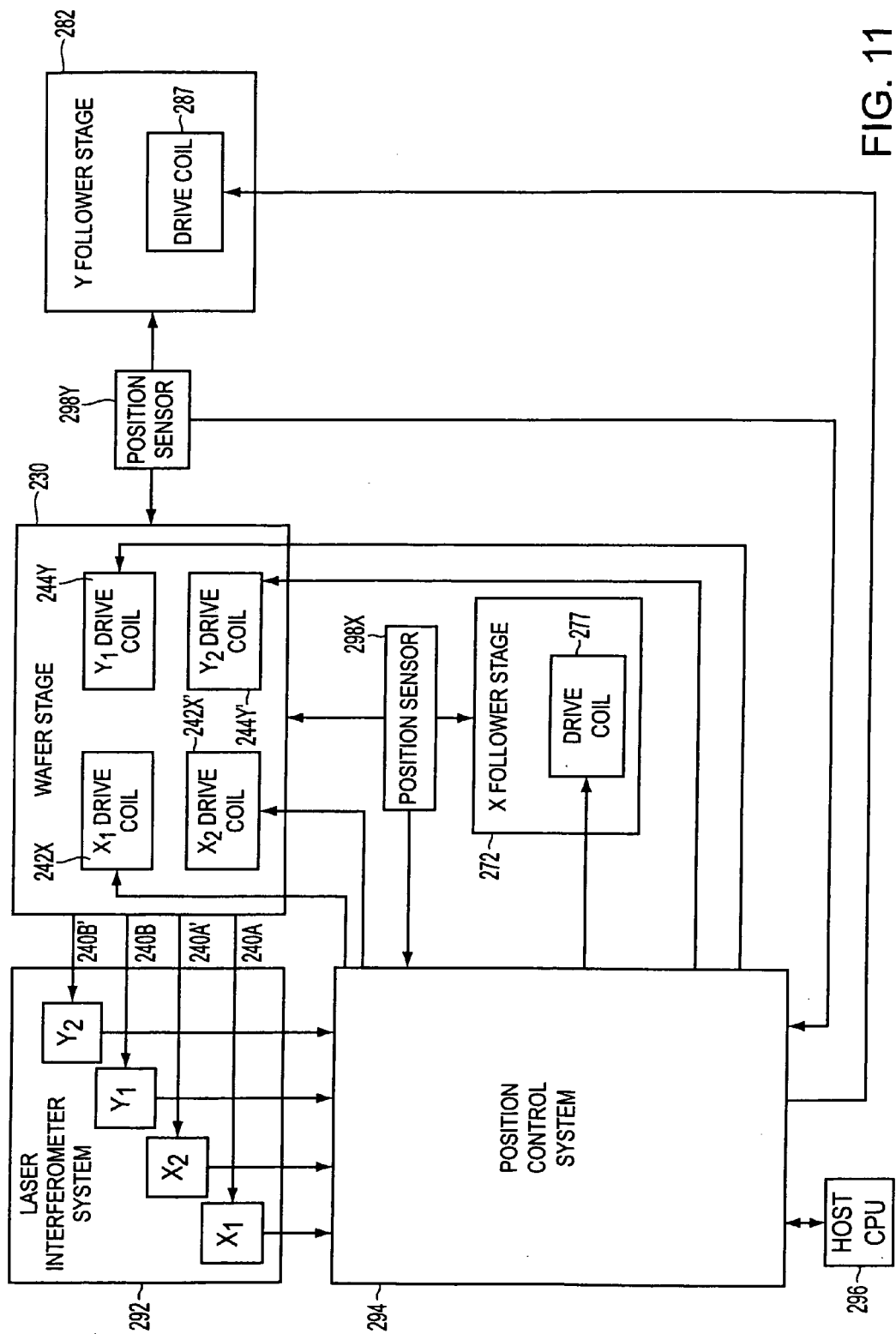
FIG. 11 is a schematic block diagram of the position sensing and control system for the preferred embodiment disclosed in U.S. patent application Ser. No. 08/221,375.

With the known position of the XY stage 230 from the interferometer system 292, drive signals are sent from the position control system 294 to the appropriate drive coils, 242X, 242X', 244Y and 244Y' to drive the XY stage to a new desired position. The motion of the XY stage is sensed by the interferometer system 292 and position sensors 298X and 298Y (see FIG. 11), and the X follower 272 and Y follower 282 are driven by the drive members 277 and 287, respectively, to follow the XY stage. As illustrated in FIG. 11, the position sensor 298X detects a variation of the Y direction space between the XY stage 230 and the X follower 272 and generates an electric signal representing the amount of space to the position control system 294. The position control system 294 generates a proper drive signal for the drive member 277 on the basis of the X position information from the interferometer system 292 and the signal from the position sensor 298X.

Also, the position sensor 298Y detects a variation of X direction space between the XY stage 230 and the Y follower 282 and generates an electric signal representing the amount of space, and the drive member 287 is energized on the basis of the Y position information from the interferometer system 292 and the signal from the position sensor 298Y.

Yaw correction is accomplished by the pairs of linear motors which can be used to hold or offset yaw, or the pairs of linear motors can change the rotational position of the XY stage. The data from either or both pairs of laser beams 240A/240A' and 240B/240B' are used to obtain yaw information. Electronic subtraction of digital position data obtained from measurement using the laser beams 240A and 240A' or 240B and 240B' is performed or both differences are added and divided by two.

This invention allows the positioning function of the XY stage to be accomplished faster than if XY guides were used. Reaction forces created in moving the XY stage can be coupled away from the image forming optics and reticle handling equipment.

This invention needs no precision X or Y guides as compared to a guided stage, and precision assembly and adjustment of the wafer XY stage is reduced due to the lack of precision guides. The servo bandwidth is increased because the linear motor forces in the XY axes act directly on the wafer stage; they do not have to act through a guide system.

Forces from the XY linear motors can all be sent substantially through the center of gravity of the XY stage thereby eliminating unwanted moments of force (torque).

With the X follower 272 and the Y follower 282 mounted and moved totally independently of one another, any vibration of a follower is not conveyed to the wafer XY stage or to the optical system when using commercially available electromagnetic linear motors for the magnetic coupling between each of the followers 272 and 282 and the XY stage 230 and with clearance between the coils and magnet drive tracks less than about 1 mm. Additionally, with the arms of one of the followers spaced above and below the arms of the other follower, the vector sum of the moments of force at the center of gravity of the XY stage due to the positioning forces of cooperating drive members is substantially equal to zero.

No connection exists between the XY stage and the follower stages that would allow vibrations to pass between them in the X, Y or theta degrees of freedom. This allows the follower stages to be mounted to a vibrating reference frame without affecting performance of the wafer stage. For example, if the reaction frame were struck by an object, the XY stage and the projection optical system would be unaffected.

It will be appreciated by a person skilled in the art that if the center of gravity is not equidistant between either of the two X drive coils or either of the two Y drive coils, that appropriate signals of differing magnitude would be sent to the respective coils to apply more force to the heavier side of the stage to drive the XY stage to the desired position.

For certain applications the drive elements 242X/242X' or 242Y/242Y' of the actuator or magnetic coupling assembly for supplying electromagnetic force to the movable XY stage may be held stationary (see FIG. 11) in a static position with respect to movement of the stage in either the X or Y direction, respectively.

Figure 7C:
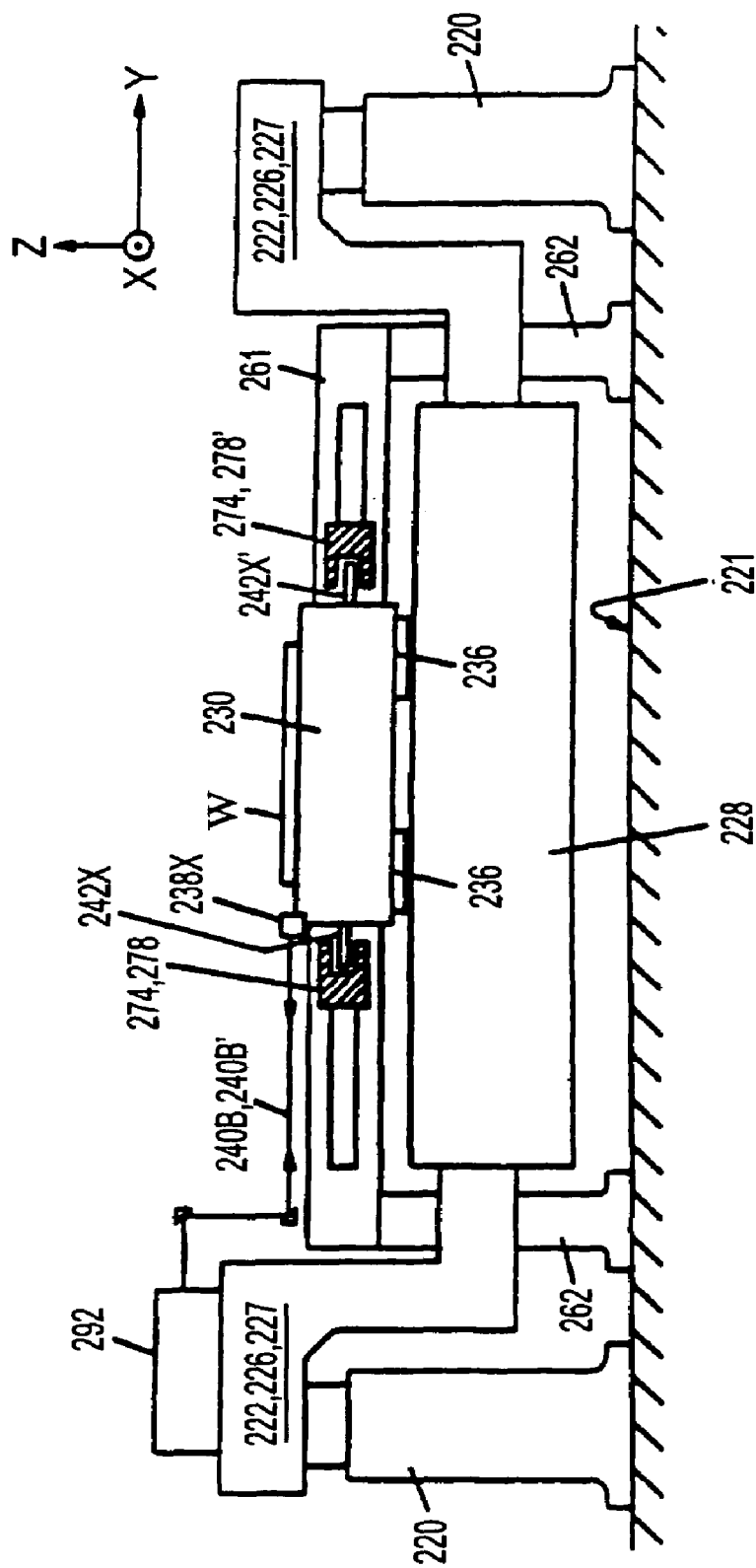
FIG. 7C is a schematic elevational view, partially in section, of the object positioning apparatus of the FIG. 7 system.

In the last of the explanation of this embodiment, referring to FIG. 7C again, the essential structure of the invention will be described. As illustrated in FIG. 7C, the XY stage 230 is suspended on the flat smooth surface (parallel with the X-Y plane) of the stage base 228 through the air bearings 236 having air discharge ports and vacuum pre-load ports and is movable in X, Y and theta direction on the stage base 228 without any friction.

The stage base 228 is supported on the foundation (or ground, base structure) 221 by the isolation blocks 220, arms 218, blocks 222, the vertical bars 226 and the horizontal bars 227. Each of the isolation blocks 220 is composed of a vibration absorbing assembly to prevent transmission of the vibration from the foundation 221.

Since FIG. 7C is a sectional view of the XY stage 230 along a line through the drive coils 242X, 242X' in Y direction, the following description is restricted about the X follower 272.

In FIG. 7C, the drive coils 242X are disposed in a magnetic field of drive track (magnet array elongated in X direction) 278 mounted on the follower arm 274 and the drive coils 242X' are disposed in a magnetic field of drive track 278' mounted on the follower arm 274'.

The two arms 274, 274' are rigidly assembled to move together in Y direction by the guide rails 269, 269' formed inside of the reaction frame 261. Also, the guide rails 269, 269' restrict the movement of the two arms 274, 274' in X and Z directions. The reaction frame 261 is directly supported on the foundation 221 by the four support posts 262 independently from the stage base 228.

Therefore, the drive coils 242X (242X') and the drive tracks 278 (278') are disposed with respect to each other to maintain a predetermined gap (a few millimeters) in Y and Z directions.

Accordingly, when the drive coils 242X, 242X' are energized to move the XY stage 230 in X direction, the reaction force generated on the drive tracks 278, 278' is transferred to the foundation 221, not to the XY stage 230.

On the other hand, as the XY stage 230 moves in Y direction, the two arms 274, 274' are moved in Y direction by the drive member 277 such that each of the drive tracks 278, 278' follows respective coils 242X, 242X' to maintain the gap in Y direction on the basis of the measuring signal of the position sensor 298X.

Figure 12:
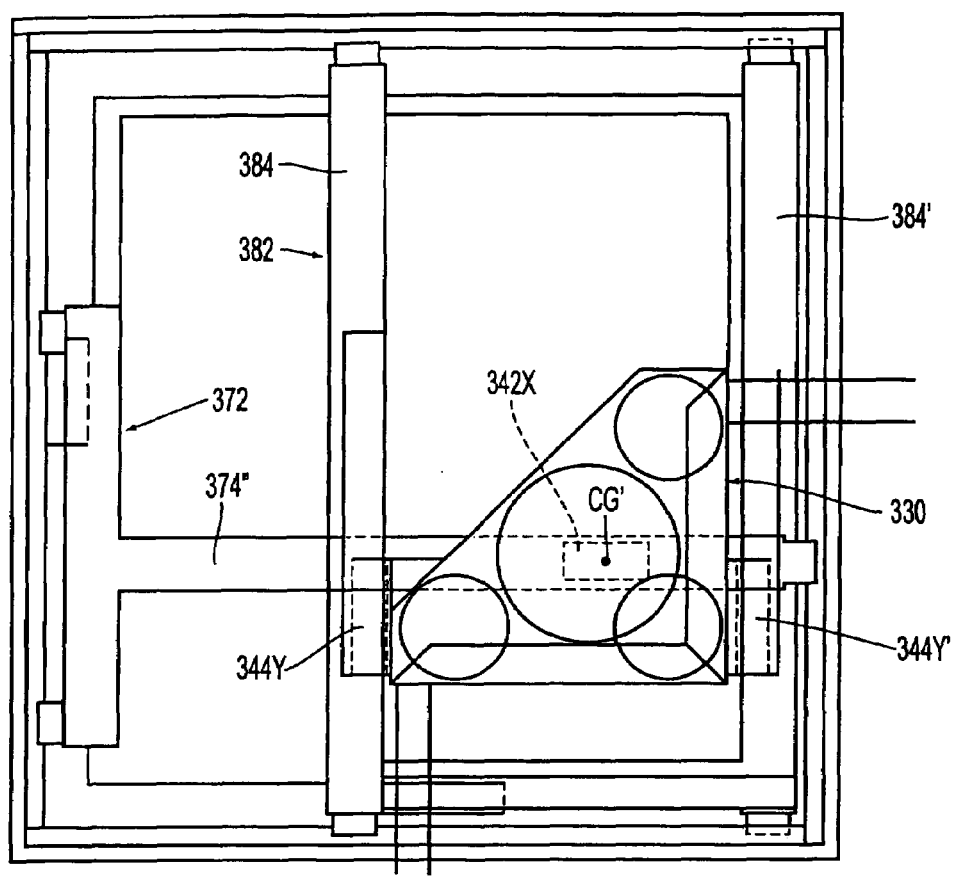
FIGS. 12 and 13 are views similar to FIGS. 8 and 9 of an alternative embodiment.
Figure 13:
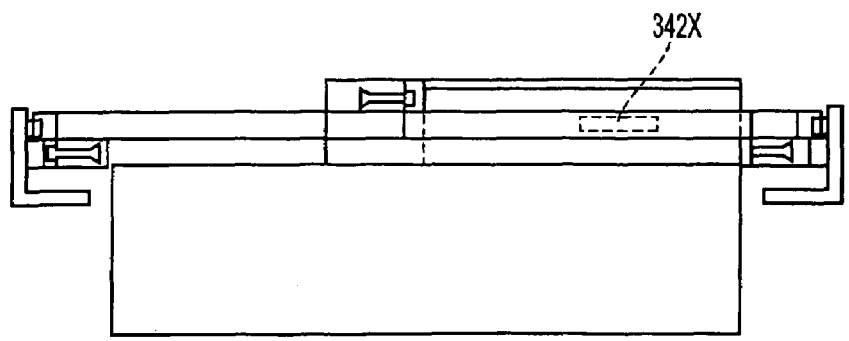
Figure 14:
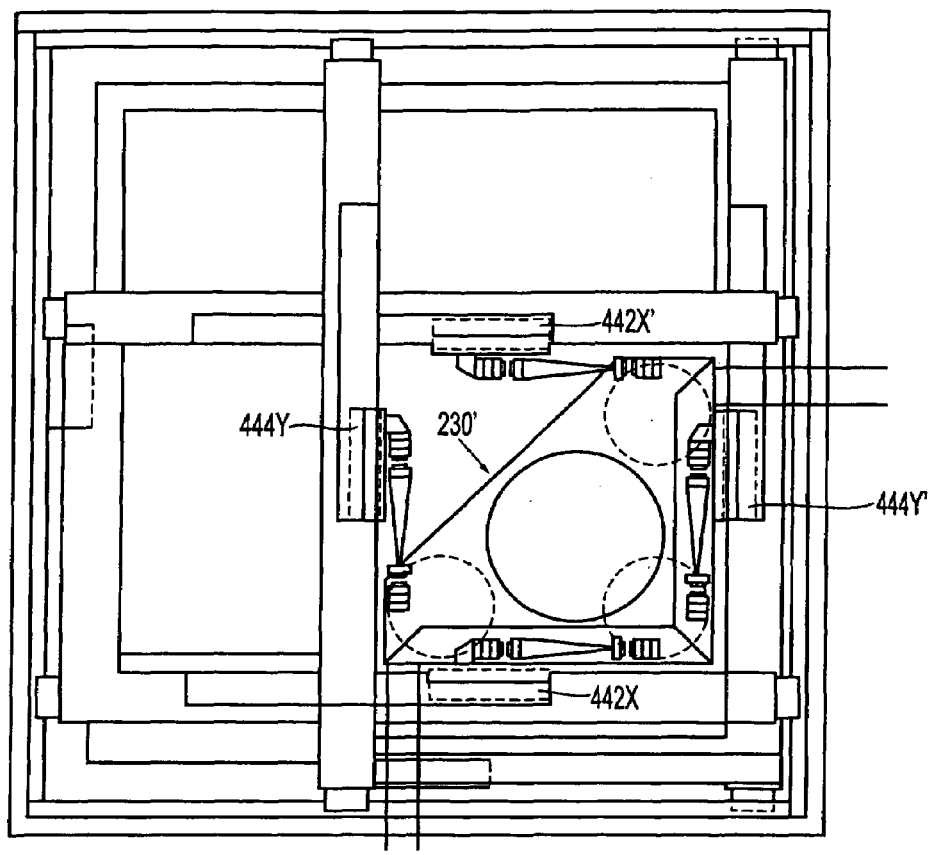
FIGS. 14 and 15 are views similar to FIGS. 8 and 9 of still another embodiment.
Figure 15:
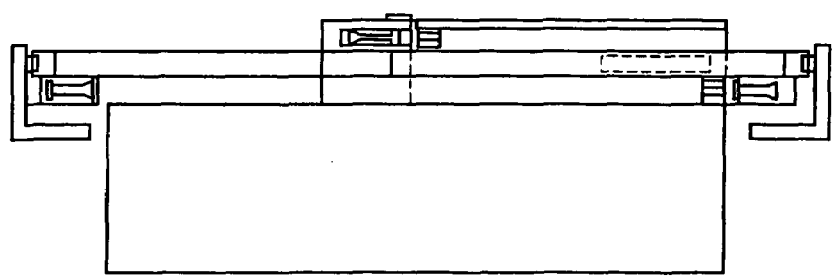
Figure 16:
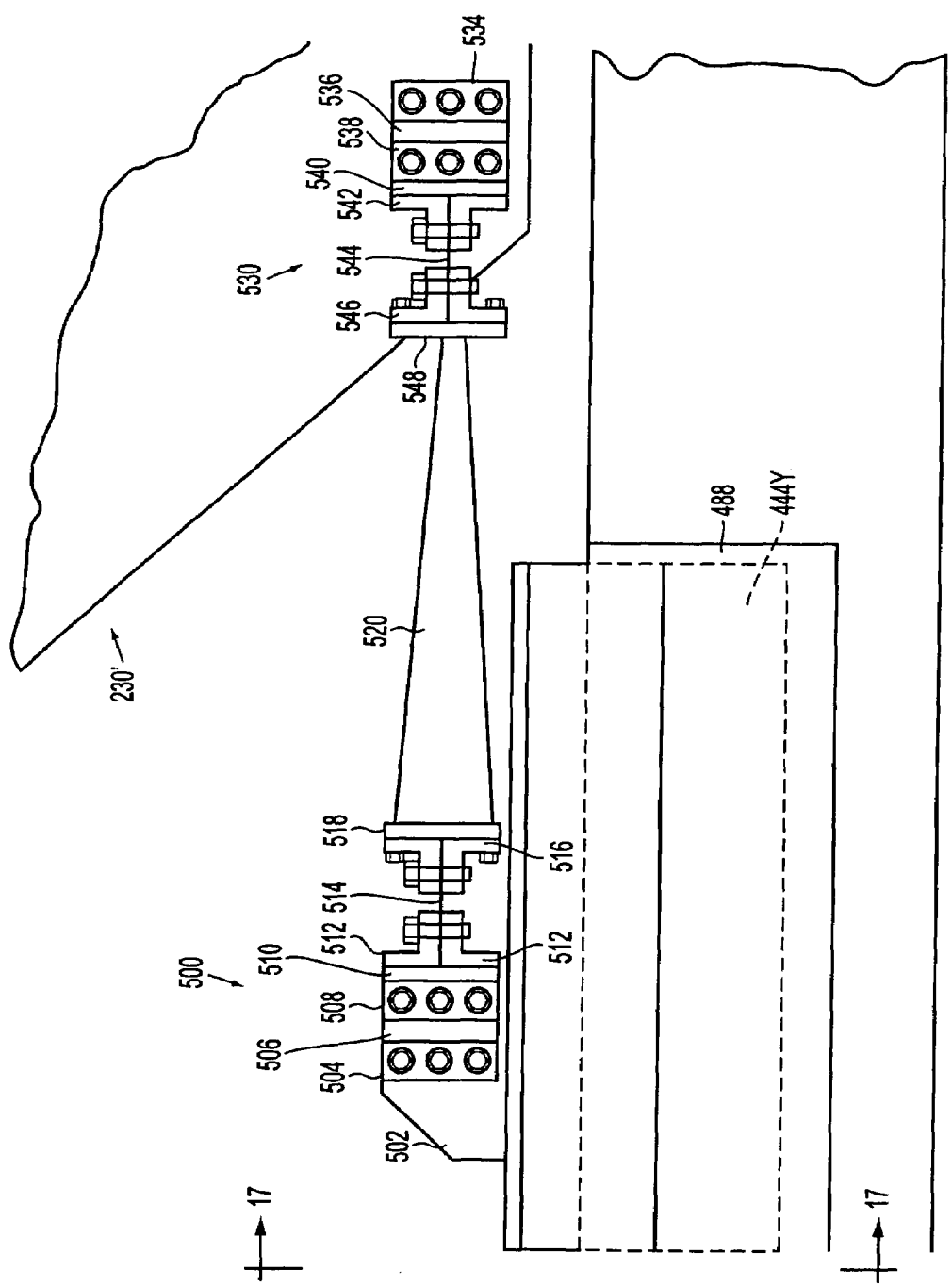
FIG. 16 is an enlarged top view of a portion of the structure shown in FIG. 14.

While the invention has been described with reference to the preferred embodiment having a pair of X drive members or coils 242X and 242X' and a pair of Y drive members or coils 244Y and 244Y', it is possible to construct a guideless stage with an isolated reaction frame in accordance with the invention with just three drive members or linear motors such as shown in FIGS. 12 and 13. As illustrated in FIG. 12, a pair of Y drive coils 344Y and 344Y' are provided on the stage 330 and a single X drive coil or linear motor 342X is mounted centered at the center of gravity CG' of the XY stage. The Y drive coils 344Y and 344Y' are mounted on the arms 384 and 384' of the Y follower 382, and the X drive coil 344X is mounted on an arm 374" of a X follower 372. By applying appropriate drive signals to the drive coils 342X and 344Y and 344Y', the XY stage can be moved to the desired XY positions.

Referring now to FIGS. 14-17, there is shown an alternative embodiment of the invention which includes links between the XY drive coils 442X, 442X', 444Y and 444Y' and the attachment to the XY stage 230'. These connections include a double flexure assembly 500 connecting the drive coil 444Y to one end of a connecting member 520 and a double flexure assembly 530 connecting the other end of the connecting member 520 to the XY stage 230'. The double flexure assembly 500 includes a flange 502 connected to the coil 444Y. A clamping member 504 is attached via clamping bolts to the flange 502 to clamp therebetween one edge of a horizontal flexible link 506. The other end of the flexible link 506 is clamped between two horizontal members 508 which are in turn integrally connected with a vertical flange 510 to which are bolted a pair of flange members 512 which clamp one edge of a vertical flexible member 514. The opposite edge of the vertical flexible member 514 is clamped between a pair of flange members 516 which are in turn bolted to a flange plate 518 on one end of the connecting member 520. At the other end of the connecting member 520 a plate 548 is connected to two flange members 236 which are bolted together to clamp one end of a vertical flexible member 544. The opposite edge of the vertical member 544 is clamped by flange members 542 which are in turn connected to a plate 540 connected to a pair of clamping plates 538 clamping one edge of a horizontal flexible member 536, the opposing edge of which is in turn clamped onto the XY stage 230' with the aid of the plate 534. Thus, in each of the double flexure assemblies 500 and 530 vibrations are reduced by providing both a horizontal and a vertical flexible member. In each of these assemblies the vertical flexible members reduce X, Y and theta vibrations and the horizontal flexible members reduce Z, tilt and roll vibrations. Thus, there are eight vertical flex joints for X, Y and theta and eight horizontal flex joints for Z, tilt and roll.

Figure 17:
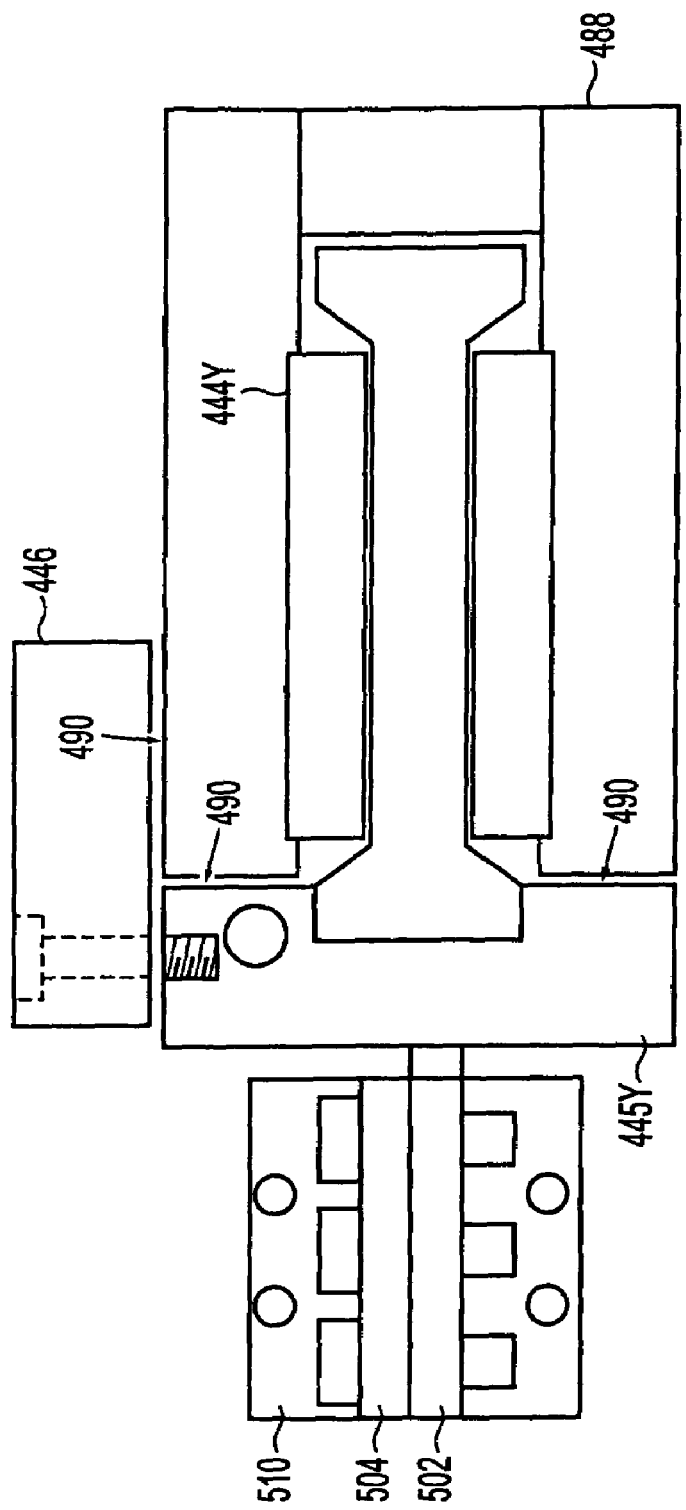
FIG. 17 is an end view of the structure shown in FIG. 16 taken along line 17-17 in the direction of the arrows.

As illustrated in FIG. 17, the coil 444Y is attached to a coil support 445Y which has an upper support plate 446 attached thereto which rides above the top of the magnetic track assembly 488. Vacuum pre-load type air bearings 490 are provided between the coil support 445Y and upper support plate 446 on the one hand and the magnetic track assembly 488 on the other hand.

In an operative example of the embodiment illustrated in FIGS. 14-17 the flexible members 506, 514, 544 and 536 are stainless steel 1¼" wide, ¼" long and 0.012" thick with the primary direction of flex being in the direction of the thickness. In the embodiment illustrated members 506 and 514 are mounted in series with their respective primary direction of flex being orthogonal to one another; members 544 and 536 are similarly mounted.

The stage 10 is (in plan view) a rectangular structure of a rigid material (e.g., steel, aluminum, or ceramic). Two interferometry mirrors 14A and 14B located on stage 10 interact conventionally with respectively laser beams 16A and 16B. Conventionally, laser beams 16A are two pairs of laser beams and laser beams 16B are one pair of laser beam, for three independent distance measurements. The underside of stage 10 defines a relieved portion 22 (indicated by a dotted line, not being visible in the plane of the drawing). A reticle 24 is located on stage 10 and held by conventional reticle vacuum groove 26 formed in the upper surface of chuck plate 28. Stage 10 also defines a central aperture 30 (passage) below the location of reticle 24. Central aperture 30 allows the light (or other) beam which penetrates through reticle 24 to enter the underlying projection lens, as described further below. (It is to be understood that the reticle 24 itself is not a part of the stage mechanism.) Moreover, if the present stage mechanism is to be used for other than a reticle stage, i.e., for supporting a wafer, aperture 30 is not needed.

Stage 10 is supported on a conventional rectangular base structure 32 of, e.g., granite, steel, or aluminum, and having a smooth planar upper surface. The left and right edges (in FIG. 1) of base structure 32 are shown as dotted lines, being overlain by other structures (as described below) in this view. In operation, stage 10 is not in direct physical contact with its base structure 32; instead, stage 10 is vertically supported by, in this example, conventional bearings such as gas bearings. In one embodiment three air bearings 36A, 36B and 36C are used which may be of a type commercially available.

In an alternative air bearing/vacuum structure, the vacuum portion is physically separated from and adjacent to the air bearing portion. It is to be understood that the vacuum and compressed air are provided externally via tubing in a conventional cable bundle and internal tubing distribution system (not shown in the drawings for simplicity). In operation, stage 10 thereby floats on the air bearings 36A, 36B, 36C approximately 1 to 3 micrometers above the flat top surface of base structure 32. It is to be understood that other types of bearings (e.g., air bearing/magnetic combination type) may be used alternatively.

Stage 10 is laterally surrounded by the "window frame guide" which is a four member rectangular structure. The four members as shown in FIG. 1 are (in the drawing) the top member 40A, the bottom member 40B, the lefthand member 40C, and the righthand member 40D. The four members 40A-40D are of any material having high specific stiffness (stiffness to density ratio) such as aluminum or a composite material. These four members 40A-40D are attached together by hinge structures which allow non-rigid movement of the four members relative to one another in the X-Y plane and about the Z-axis as shown in the drawing, this movement also referred to as a "yaw" movement. The hinge is described in detail below, each hinge 44A, 44B, 44C and 44D being, e.g., one or more metal flexures allowing a slight flexing of the window frame guide structure.

The window frame guide structure moves in the X axis (to the left and right in FIG. 1) supported on horizontal surfaces of fixed guides 46A and 46B, and supported on vertical surfaces of fixed guides 64A, 64B. (It is to be understood that each pair of fixed guides 46A, 64A and 46B, 64B could be, e.g., a single L-shaped fixed guide, or other configurations of fixed guides may be used.) Mounted on window frame guide member 40A are two air bearings 50A and 50B that cause the member 40A to ride on its supporting fixed guide member 46A. Similarly, air bearings 52A and 52B are mounted on the member 40B, allowing member 40B to ride on its supporting fixed guide member 46B. Air bearings 50A, 50B, 52A, 52B are similar to air bearings 36A, etc.

The window frame guide is driven along the X axis on fixed guides 46A and 46B, 64A and 64B by a conventional linear motor, which includes a coil 60A which is mounted on window frame guide member 40A. Motor coil 60A moves in a magnetic track 62A which is located in (or along) fixed guide 64A. Similarly, motor coil 60B which is mounted on window frame guide member 40B moves in magnetic track 62B which is located in fixed guide 64B. The motor coil and track combinations are part no. LM-310 from Trilogy Company of Webster Tex. These motors are also called "linear commutator motors". The tracks 62A, 62B are each a number of permanent magnets fastened together. The electric wires which connect to the motor coils are not shown but are conventional. Other types of linear motors may be substituted. It is to be understood that the locations of the motor coils and magnetic tracks for each motor could be reversed, so that for instance the magnetic tracks are located on stage 10 and the corresponding motor coils on the window frame guide members, at a penalty of reduced performance.

Similarly, stage 10 moves along the Y axis in FIG. 1 by means of motor coils 68A and 68B mounted respectively on the left and right edges of stage 10. Motor coil 68A moves in magnetic track 70A mounted in window frame guide member 40C. Motor coil 68B moves in magnetic track 70B mounted in window frame guide member 40D.

Also shown in FIG. 1 are air bearings 72A, 72B and 72C. Air bearing 72A is located on window frame guide member 40A and minimizes friction between window frame guide member 40A and its fixed guide 64A. Similarly, two air bearings 72B and 72C on window frame guide member 40B minimize its friction with the fixed guide 64B. The use of a single air bearing 72A at one end and two opposing air bearings 72B and 72C at the other end allows a certain amount of yaw (rotation in the X-Y plane about the Z-axis) as well as limited motion along the Z-axis. In this case, typically air bearing 72A is gimbal mounted, or gimbal mounted with the gimbal located on a flexure so as to allow a limited amount of misalignment between the member 40A and fixed guide 64A.

The use of the air bearing 72A opposing bearings 72B and 72C provides a loading effect to keep the window frame guide in its proper relationship to fixed guides 64A, 64B. Similarly, an air bearing 76A loads opposing air bearings 76B and 76C, all mounted on side surfaces of the stage 10, in maintaining the proper location of stage 10 relative to the opposing window frame guide members 40B and 40D. Again, in this case one air bearing such as 76A is gimbal mounted to provide a limited amount of misalignment, or gimbal mounted with the gimbal on a flexure (spring). Air bearings 72A, 72B, 72C and 76A, 76B, and 76C are conventional air bearings.

The outer structure 80 in FIG. 1 is the base support structure for the fixed guides 46A, 46B, 64A, 64B and the window frame guide members 40A, . . . , 40D of the stage mechanism, but does not support stage base structure 32. Thus, the underlying support is partitioned so the reaction force on base support structure 80 does not couple into the stage base structure 32. Base support structure 80 is supported by its own support pillars or other conventional support elements (not shown in this drawing) to the ground, i.e., the surface of the earth or the floor of a building. An example of a suitable support structure is disclosed in above-referenced U.S. patent application Ser. No. 08/221, 375 at FIGS. 1, 1B, 1C (FIGS. 7, 7B, 7C of the present application). This independent support structure for this portion of stage mechanism provides the above-described advantage of transmitting the reaction forces of the reticle stage mechanism drive motors away from the frame supporting the other elements of the photolithography apparatus, especially away from the optical elements including the projection lens and from the wafer stage, thereby minimizing vibration forces on the projection lens due to reticle stage movement. This is further described below.

The drive forces for the stage mechanism are provided as close as possible through the stage mechanism center of gravity. As can be understood, the center of gravity of the stage mechanism moves with the stage 10. Thus, the stage 10 and the window frame guide combine to define a joint center of gravity. A first differential drive control (not shown) for motor coils 60A, 60B takes into account the location of the window frame guide to control the force exerted by each motor coil 60A, 60B to keep the effective force applied at the center of gravity. A second conventional differential drive control (not shown) for motor coils 68A, 68B takes into account the location of stage 10 to control the force exerted by each motor coil 68A, 68B to keep the effective force applied at the center of gravity. It is to be understood that since stage 10 has a substantial range of movement, that the differential drive for the motor coils 60A, 60B has a wide differential swing. In contrast, the window frame guide has no CG change, hence the differential drive for the motor coils 68A, 68B has a much lesser differential swing, providing a trim effect. Advantageously, use of the window frame guide maintains the reaction forces generated by movement of the reticle stage mechanism in a single plane, thus making it easier to isolate these forces from other parts of the photolithography apparatus.

Figure 2:
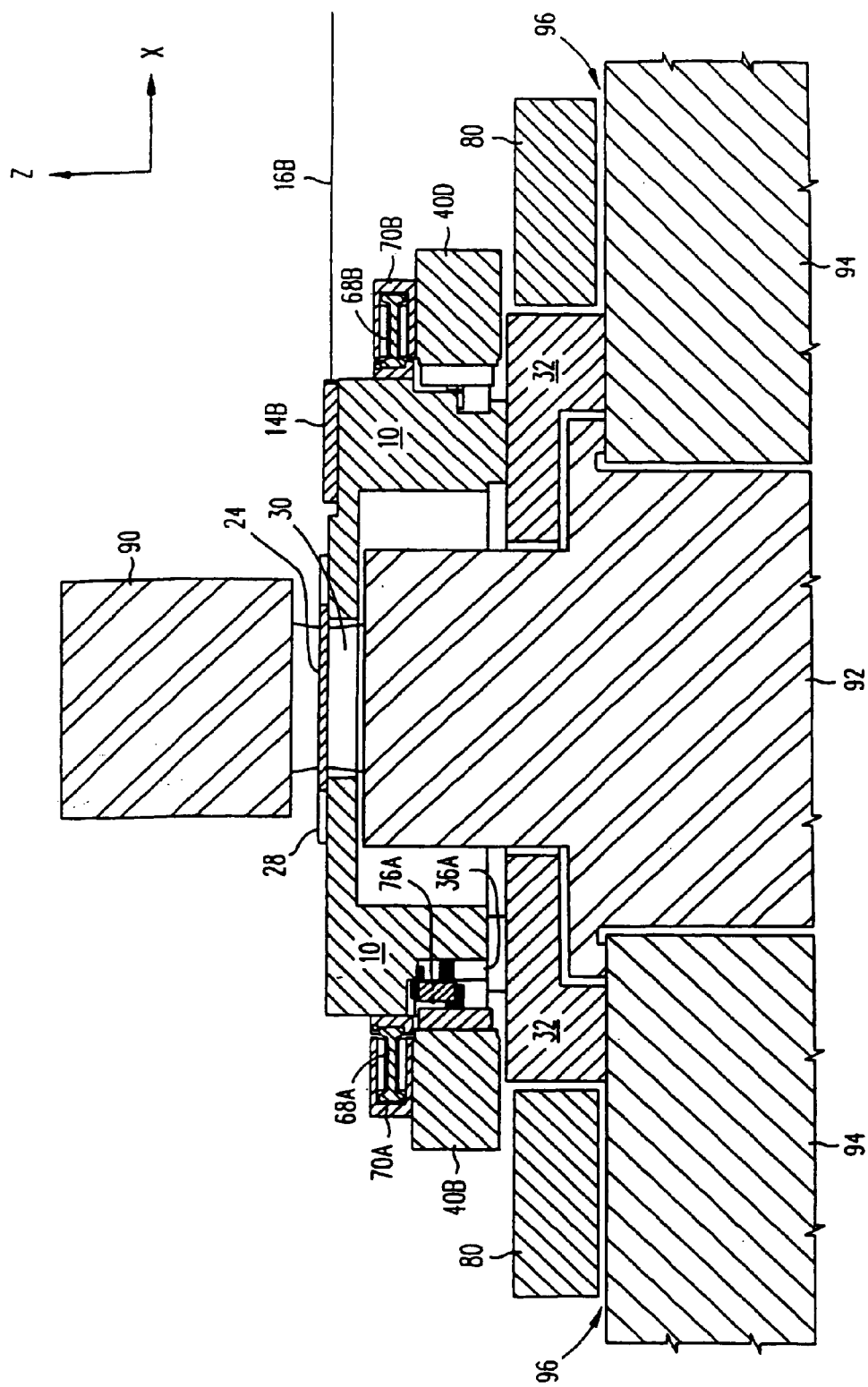
FIG. 2 shows a side view of the window frame guided stage and associated structures.

FIG. 2 shows a cross-sectional view through line 2-2 of FIG. 1. The structures shown in FIG. 2 which are also in FIG. 1 have identical reference numbers and are not described herein. Also shown in FIG. 2 is the illuminator 90 which is a conventional element shown here without detail, and omitted from FIG. 1 for clarity. Also shown without detail in FIG. 2 is the upper portion of the projection lens (barrel) 92. It is to be understood that the lower portion of the projection lens and other elements of the photolithography apparatus are not shown in FIG. 2, but are illustrated and described below.

The supporting structure 94 for the projection lens 92 is also shown in FIG. 2. As can be seen, structure 94 is separated at all points by a slight gap 96 from the base support structure 80 for the reticle stage mechanism. This gap 96 isolates vibrations caused by movement of the reticle stage mechanism from the projection lens 92 and its support 94. As shown in FIG. 2, stage 10 is not in this embodiment a flat structure but defines the underside relieved portion 22 to accommodate the upper portion of lens 92. Magnetic track 70A is mounted on top of the window frame guide 40B, and similarly magnetic track 70B is mounted on top of the opposite window frame guide member 40D.

Figure 3A:
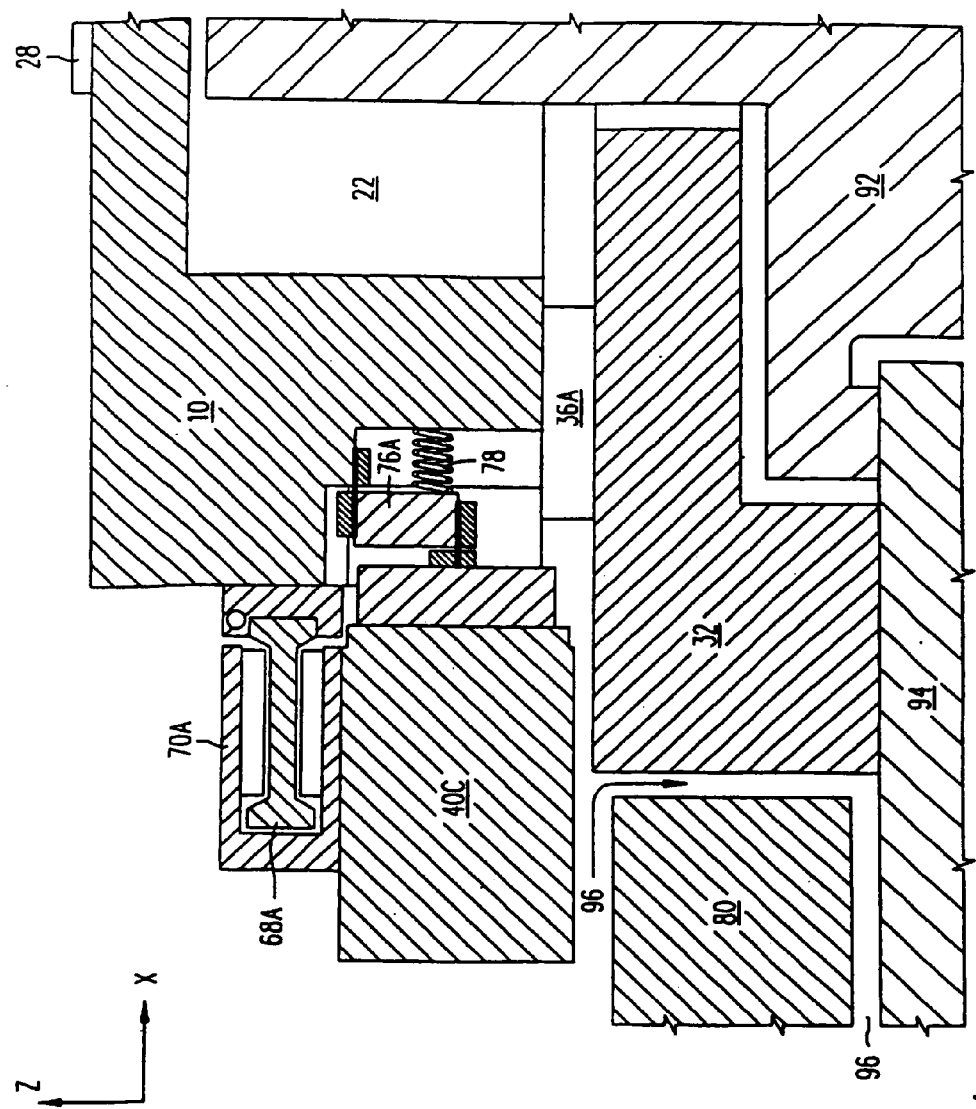
FIGS. 3A and 3B show enlarged views of portions of the structure of FIG. 2.
Figure 3B:
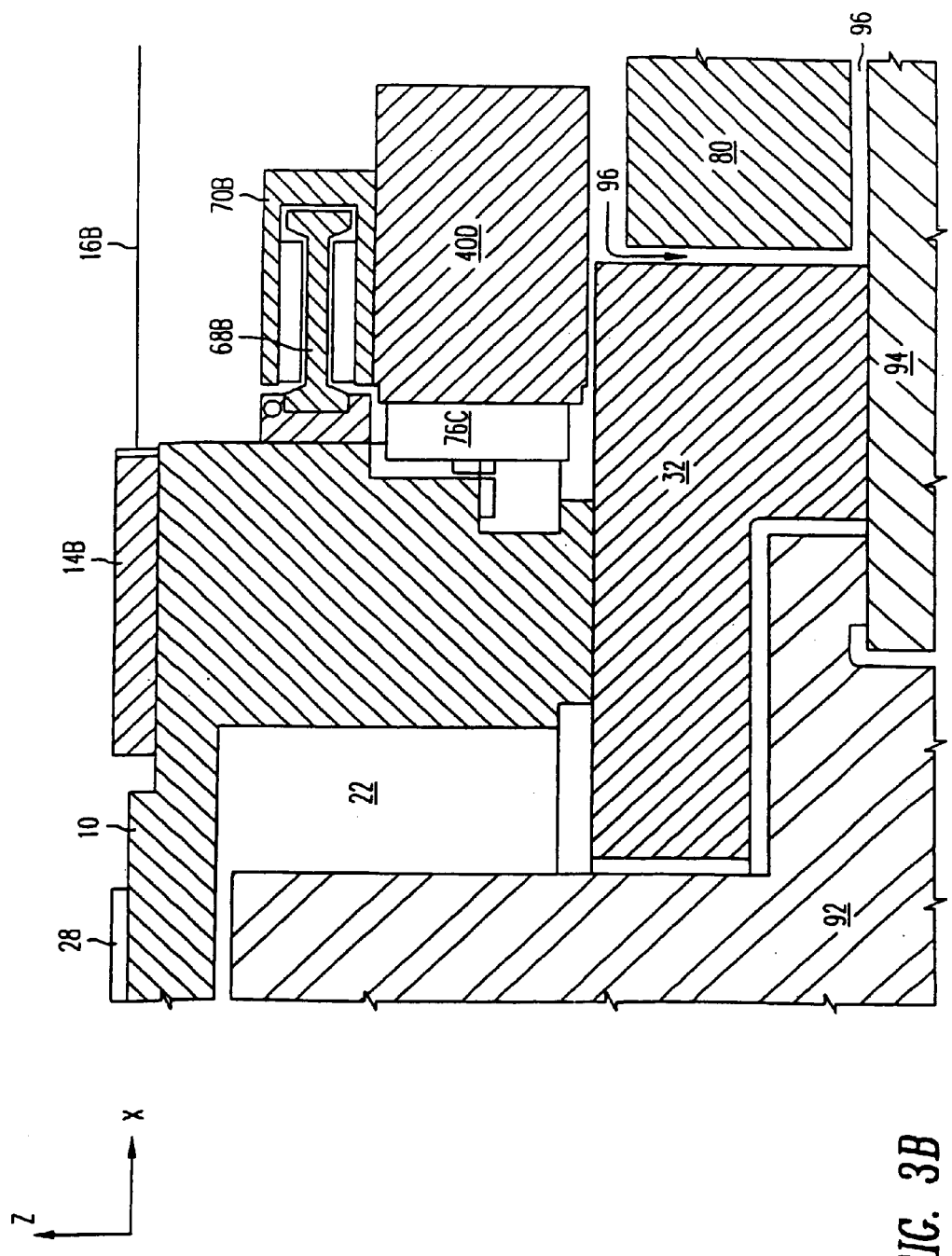

FIGS. 3A and 3B are enlarged views of portions of FIG. 2, with identical reference numbers; FIG. 3A is the left side of FIG. 2 and FIG. 3B is the right side of FIG. 2. Shown in FIG. 3A is the spring mounting 78 for air bearing 76A. Air bearing 78A being spring mounted to a side surface of stage 10, this allows a certain amount of yaw (rotation in the X-Y plane about the Z-axis) as well as limited motion along the Z-axis. A gimbal mounting may be used in place of or in addition to the spring 78. The spring or gimbal mounting thereby allows for a limited amount of misalignment between stage 10 and members 40C, 40D (not shown in FIG. 3A).

Figure 4:
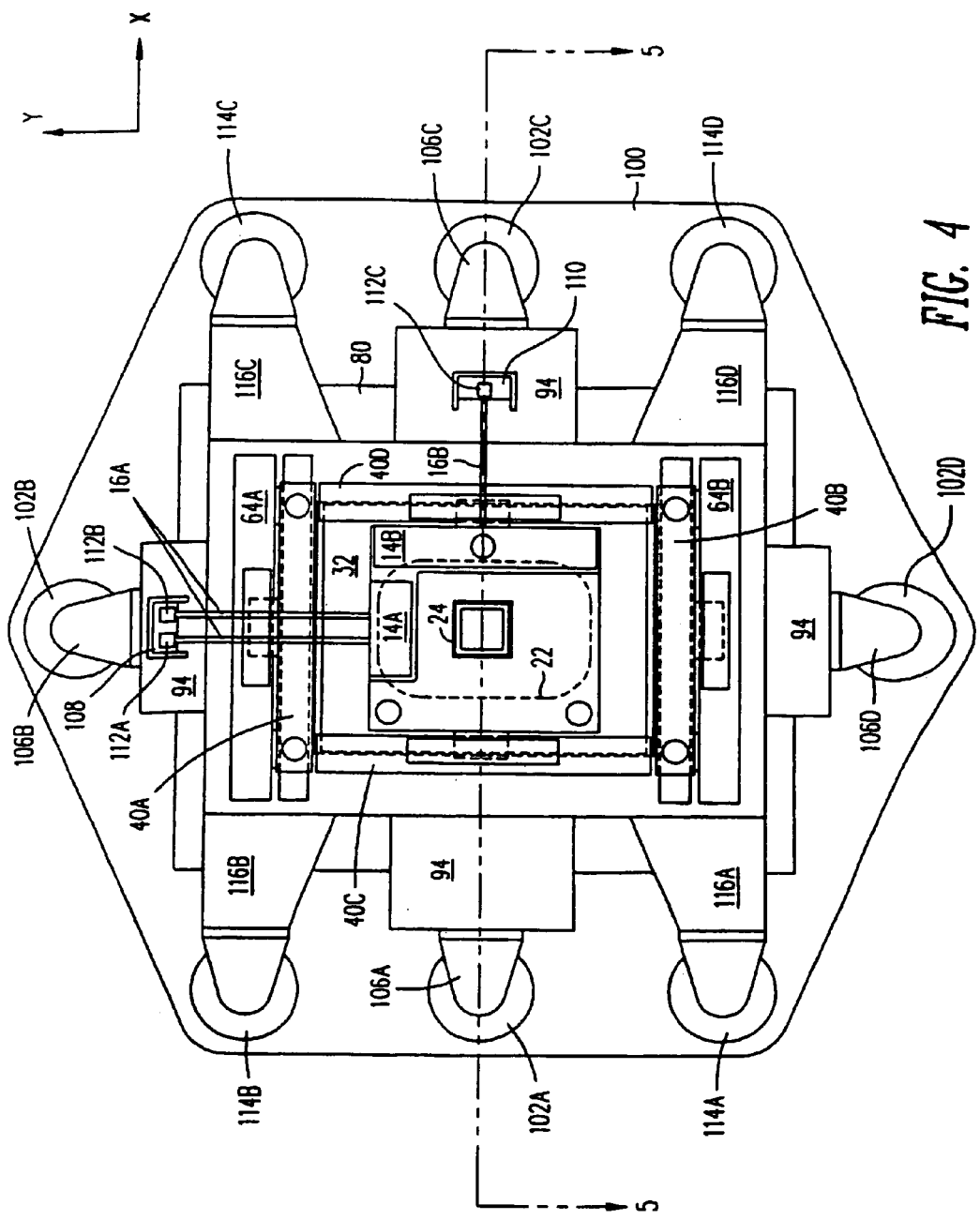
FIG. 4 shows a top view of a photolithography apparatus including the window frame guided stage.

FIG. 4 is a top view of a photolithography apparatus including the stage mechanism of FIGS. 1 and 2 and further including, in addition to the elements shown in FIG. 1, the supporting base structure 100 which supports the photolithography apparatus including frame 94 except for the reticle stage mechanism. (Not all the structures shown in FIG. 1 are labeled in FIG. 4, for simplicity.) Base structure 100 supports four vertical support pillars 102A, 102B, 102C and 102D connected to structure 94 by respective bracket structures 106A, 106B, 106C and 106D. It is to be appreciated that the size of the base structure 100 is fairly large, i.e., approximately 3 meters top to bottom in one embodiment. Each pillar 102A, 102B, 102C, 102D includes an internal conventional servo mechanism (not shown) for leveling purposes. Also shown in FIG. 4 are the supports 108 and 110 for respective laser interferometer units (beam splitter etc.) 112A, 112B, 112C. FIG. 4 will be further understood with reference to FIG. 5 which shows a view of FIG. 4 through cross-sectional line 5-5 of FIG. 4.

Figure 5:
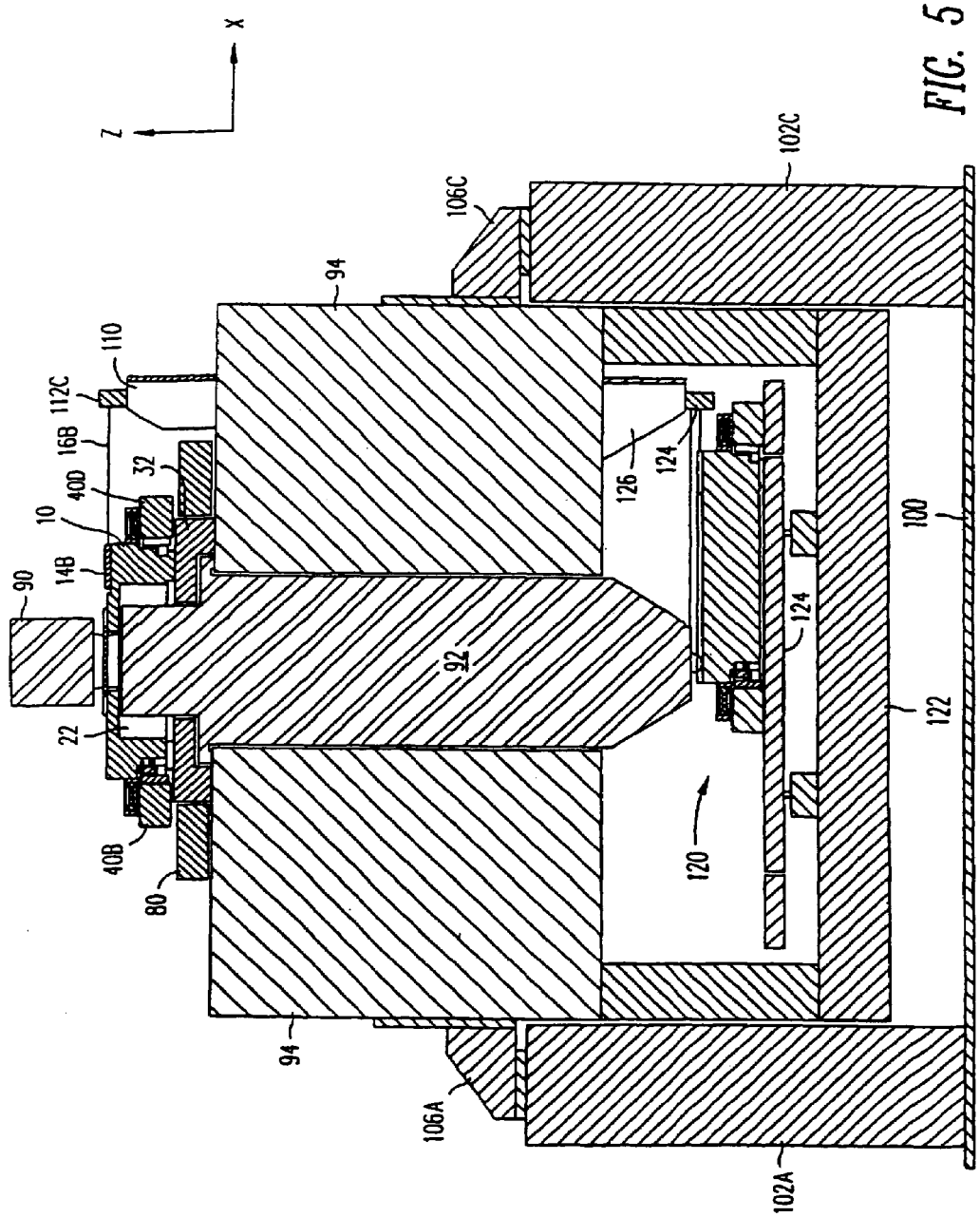
FIG. 5 shows a side view of the photolithography apparatus of FIG. 4.

In FIGS. 4 and 5 the full extent of the supporting structure 94 can be seen along with its support pillars 102A, 102C which rest on the base structure 100 which is in contact with the ground via a conventional foundation (not shown). The independent support structure for the reticle stage base support structure 80 is shown, in FIG. 4 only (for clarity) and similarly includes a set of four pillars 114A, 114B, 114C, 114D with associated bracket structures 116A, 116B, 116C, 116D, with the pillars thereby extending from the level of base support structure 80 down to the base structure 100.

The lower portion of FIG. 5 shows the wafer stage 120 and associated support structures 122, 124. The elements of wafer stage 120 conventionally include (not labeled in the drawing) a base, the stage itself, fixed stage guides located on the base, magnetic tracks located on the fixed stage guides, and motor coils fitting in the magnetic tracks and connected to the stage itself. Laser beams from laser 124 mounted on support 126 locate lens 92 and the stage itself by interferometry.

Figure 6A:
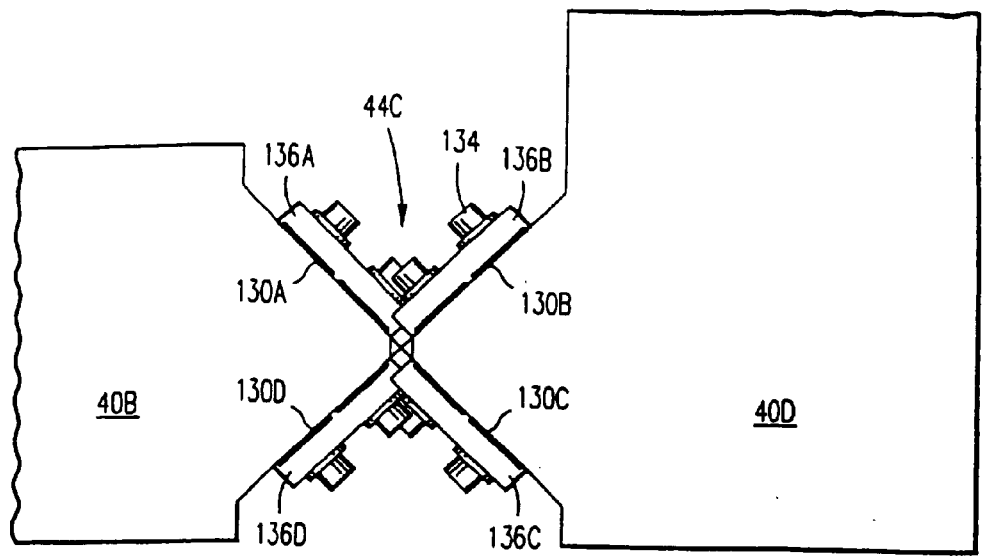
FIGS. 6A and 6B show a flexure hinge structure as used, e.g., in the window frame guided stage.

FIG. 6A shows detail of one of the window frame guide hinged flexure structures, e.g., 44C, in a top view (corresponding to FIG. 1). Each of hinges 44A, 44B, 44C and 44D is identical. These flexure hinges have the advantage over a mechanical-type hinge of not needing lubrication, not exhibiting hysteresis (as long as the flexure is not bent beyond its mechanical tolerance) and not having any mechanical "slop", as well as being inexpensive to fabricate.

Each individual flexure is, e.g., ¼ hard 302 stainless steel approximately 20 mils (0.02 inch) thick and can sustain a maximum bend of 0.5 degree. The width of each flexure is not critical; a typical width is 0.5 inch. Two, three or four flexures are used at each hinge 44A, 44B, 44C and 44D in FIG. 1. The number of flexures used at each hinge is essentially determined by the amount of space available, i.e., the height of the window frame guide members. The four individual flexures 130A, 130B, 130C, 130D shown in FIG. 6A (and also in a 90 degree(s) rotated view in FIG. 6B) are each attached by clamps 136A, 136B, 136C, 136D to adjacent frame members (members 40B and 40D in FIGS. 6A and 6B) by conventional screws which pass through holes in the individual flexures 130A, 130B, 130C, 130D and through the clamps and are secured in corresponding threaded holes in frame members 40B and 40D.

Figure 6B:
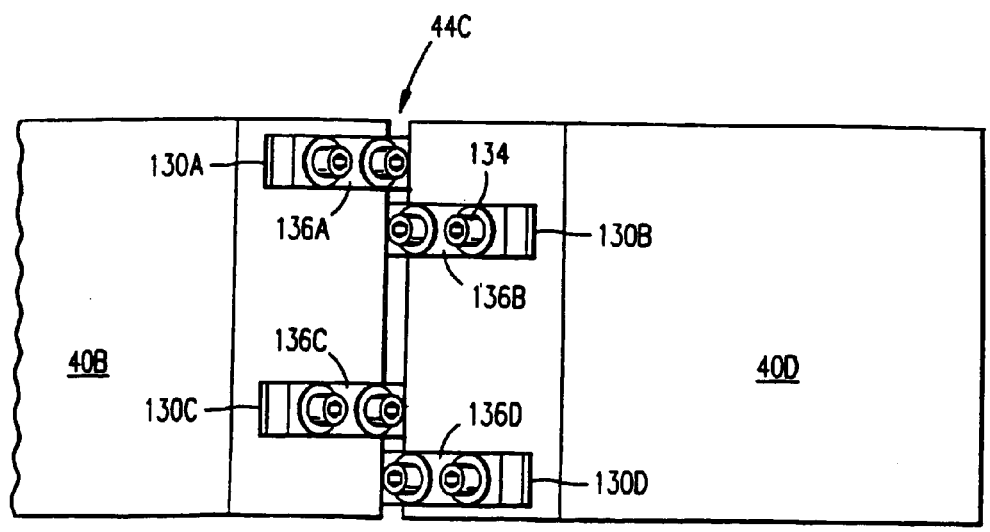

Note that the frame members 40B, 40D of FIGS. 6A and 6B differ somewhat from those of FIG. 1 in terms of the angular (triangular) structures at the ends of frame members 40B, 40D and to which the metal flexures 130A, 130B, 130C, 130D are mounted. In the embodiment of FIG. 1, these angular structures are dispensed with, although their presence makes screw mounting of the flexures easier.

In an alternate embodiment, the window frame guide is not hinged but is a rigid structure. To accommodate this rigidity and prevent binding, one of bearings 72C or 72B is eliminated, and the remaining bearing moved to the center of member 40B, mounted on a gimbal with no spring. The other bearings (except those mounted on stage 10) are also gimballed.

This disclosure is illustrative and not limiting; further modifications will be apparent to one skilled in the art in light of this disclosure and are intended to fall within the scope of the appended claims.

What is claimed is:

1. A positioning device comprising an object table, a sub-system for processing an object to be placed on the object table, a drive unit for displacing the object table relative to the sub-system, and a measuring system for measuring a position of the object table relative to the sub-system, the drive unit comprising a stationary part which is fastened to a first frame of the positioning device, while the measuring system comprises a stationary part and a movable part which is fastened to the object table for cooperation with the stationary part of the measuring system, characterized in that the stationary part of the measuring system is fastened to a second frame of the positioning device which is dynamically isolated from the first frame.

2. A positioning device as claimed in claim 1, characterized in that the object table is displaceable over a guide parallel to at least an X-direction, the guide being fastened to the second frame.

3. A positioning device comprising an object table, a sub-system for processing an object to be placed on the object table, a drive unit for displacing the object table relative to the sub-system, and a measuring system for measuring a position of the object table relative to the sub-system, the drive unit comprising a stationary part which is fastened to a first frame of the positioning device, while the measuring system comprises a stationary part and a movable part which is fastened to the object table for cooperation with the stationary part of the measuring system, characterized in that the stationary part of the measuring system is fastened to a second frame of the positioning device which is dynamically isolated from the first frame, and in that the sub-system is fastened to the second frame.

4. A lithographic device comprising a radiation source, a mask table, a projection system having a main axis, a substrate table, a drive unit for displacing the substrate table relative to the projection system in at least one direction perpendicular to the main axis, and a measuring system for measuring a position of the substrate table relative to the projection system, the drive unit comprising a stationary part which is fastened to a first frame of the lithographic device, while the measuring system comprises a stationary part and a movable part which is fastened to the substrate table for cooperation with the stationary part of the measuring system, characterized in that the stationary part of the measuring system is fastened to a second frame of the lithographic device which is dynamically isolated from the first frame.

5. A lithographic device as claimed in claim 4, characterized in that the substrate table is displaceable over a guide which extends perpendicular to the main axis and is fastened to the second frame.

6. A lithographic device comprising a radiation source, a mask table, a projection system having a main axis, a substrate table, a drive unit for displacing the substrate table relative to the projection system in at least one direction perpendicular to the main axis, and a measuring system for measuring a position of the substrate table relative to the projection system, the drive unit comprising a stationary part which is fastened to a first frame of the lithographic device, while the measuring system comprises a stationary part and a movable part which is fastened to the substrate table for cooperation with the stationary part of the measuring system, characterized in that the stationary part of the measuring system is fastened to a second frame of the lithographic device which is dynamically isolated from the first frame, and in that the lithographic device comprises a further drive unit for displacing the mask table relative to the projection system in a scanning direction perpendicular to the main axis, the further drive unit comprising a stationary part which is fastened to the first frame, while the substrate table is displaceable relative to the projection system parallel to at least the scanning direction, the measuring system comprising a further stationary part which is fastened to the second frame and a further movable part which is fastened to the mask table for cooperation with the further stationary part of the measuring system for measuring a position of the mask table relative to the projection system or for measuring a position of the mask table relative to the substrate table.

7. A lithographic device as claimed in claim 6, characterized in that the mask table is displaceable over a first guide extending parallel to the scanning direction and the substrate table is displaceable over a second guide extending perpendicularly to the main axis, the first guide and the second guide being fastened to the second frame.

8. A lithographic device comprising a radiation source, a mask table, a projection system having a main axis, a substrate table, a drive unit for displacing the substrate table relative to the projection system in at least one direction perpendicular to the main axis, and a measuring system for measuring a position of the substrate table relative to the projection system, the drive unit comprising a stationary part which is fastened to a first frame of the lithographic device, while the measuring system comprises a stationary part and a movable part which is fastened to the substrate table for cooperation with the stationary part of the measuring system, characterized in that the stationary part of the measuring system is fastened to a second frame of the lithographic device which is dynamically isolated from the first frame, and in that the projection system is fastened to the second frame.

* * * * *